US005483470A

United States Patent [19]
Alur et al.

[11] Patent Number: 5,483,470
[45] Date of Patent: Jan. 9, 1996

[54] TIMING VERIFICATION BY SUCCESSIVE APPROXIMATION

[75] Inventors: Rajeev Alur, Murray Hill; Alon Itai, Westfield, both of N.J.; Robert P. Kurshan, New York, N.Y.; Mihalis Yannakakis, Summit, N.J.

[73] Assignee: AT&T Corp., Murray Hill, N.J.

[21] Appl. No.: 906,082

[22] Filed: Jun. 29, 1992

Related U.S. Application Data

[63] Continuation-in-part of Ser. No. 489,438, Mar. 6, 1990, Pat. No. 5,163,016.

[51] Int. Cl.$^6$ ........................................... G06F 17/00
[52] U.S. Cl. ............................................. 364/578
[58] Field of Search ........................... 364/578, 232.3, 364/281.6, 933.8, 488, 489, 512, 553; 395/500, 66, 67, 919, 920, 921, 922

[56] References Cited

U.S. PATENT DOCUMENTS

| | | | |
|---|---|---|---|
| 4,587,625 | 5/1986 | Marino, Jr. et al. | 364/578 |
| 5,163,026 | 11/1992 | Har'el et al. | 364/578 |

OTHER PUBLICATIONS

Alur, R. and Dill, D. L., "Automata for modeling real–time systems," in Automata, Languages, and Programming: Proceedings of the 17th ICALP, Lecture Notes in Computer Science 443, pp. 322–335, Springer–Verlag, 1990.
Kurshan, R. P., "Reducibility on Analysis of Coordination," published in Lecture Notes in Computer Science (LNICS) 103 titled Discrete Event Systems: Models and Applications, Springer–Verlag, pp. 19–39, (1987).
Hopcroft, J. E., "An n log n Algorithm for Minimizing the States in a Finite Automaton," Theory of Machines and Computations, (Kohavi, Paz, eds.) Academic Press, pp. 189–196 (no date).
Kurshan, R. P., "Analysis of Discrete Event Coordination," in Lecture Notes in Computer Science, vol. 430, pp. 414–453, Springer–Verlag, 1990.
Dill, D. L., "Timing Assumptions and Verification of Finite–State Concurrent Systems," in Automatic Verification Methods for Finite State Systems, Lecture Notes in Computer Science 407, Springer–Verlag, 1989.
Yannakakis, M., "Graph–Theoretic Methods in Database Theory," in Proc. of the 9th ACM Symp. on Principles of Data Base Systems, pp. 230–242, 1990.

*Primary Examiner*—Ellis B. Ramirez
*Attorney, Agent, or Firm*—Gordon E. Nelson

[57] ABSTRACT

Apparatus for developing and verifying systems. The disclosed apparatus employs a computationally-tractable technique for verifying whether a system made up of a set of processes, each of which has at least one delay constraint associated with it, satisfies a given temporal property. The technique deals with the verification as a language inclusion problem, i.e., it represents both the set of processes and the temporal property as automata and determines whether there is a restriction of the set of processes such that the language of the automaton representing the restricted set of processes is included in the language of the automaton representing the temporal property. The technique is computationally tractable because it deals with the problem iteratively: it tests whether a current restriction of the set of processes is included, and if not, it employs a counter-example for the inclusion to either determine that the delay constraints render satisfaction of the given temporal property or to derive a new restriction of the set of processes. Further included in the disclosure are techniques for checking the timing consistency of the counter-example with respect to a delay constraint and techniques for finding the optimal delay constraint.

11 Claims, 11 Drawing Sheets

FIG. 7

```
module - finite state machine 1 while TRUE
  {

Set state vectors
  Set mode switch (mode)
     {
     case 'select':
         switch (state vector)
            {
            case '1':
                    action statements
                    error statements
            case '2':
                    action statements
                    error statements
            case '3':
                    action statements
                    error statements
              .
              .
              .
            }
     case 'resolve':
         switch (state vector)
            {
            case '1':
                    action statements
                    error statements
            case '2':
                    action statements
                    error statements
            case '3':
                    action statements
                    error statements
              .
              .
              .
```

FIG. 8

*Input:* Processes $P_1, \ldots, P_k, T$, and a delay constraint $D = (\Delta_P, \alpha, \beta)$.
*Output:* Decides whether the inclusion $\mathcal{L}_D(\otimes_i P_i) \subseteq \mathcal{L}(T)$ holds.
*Algorithm:*
Initially: $P = \otimes_i P_i$ and $E = 1$.
Loop forever
 1. If $\mathcal{L}(P \otimes E) \subseteq \mathcal{L}(T)$ then stop (the desired inclusion holds).
 2. Choose $\mathbf{x} = \sigma' \sigma^\omega$ in $\mathcal{L}(P \otimes E) - \mathcal{L}(T)$.
 3. If $\mathbf{x}$ is timing consistent with the delay constraint $D$ then stop (the desired inclusion does not hold).
 4. Find a minimal set of delays $\Delta(\mathbf{x}) \subseteq \Delta_P$ such that $\mathbf{x}$ is timing inconsistent with $(\Delta(\mathbf{x}), \alpha, \beta)$.
 5. Find an optimal delay constraint $D(\mathbf{x}) = (\Delta(\mathbf{x}), \alpha', \beta')$ such that $\mathbf{x}$ is timing inconsistent with $D(\mathbf{x})$.
 6. Construct the region automaton $P_{D(\mathbf{x})}$.
 7. Set $E$ to the minimized version of the product $E \otimes P_{D(\mathbf{x})}$.

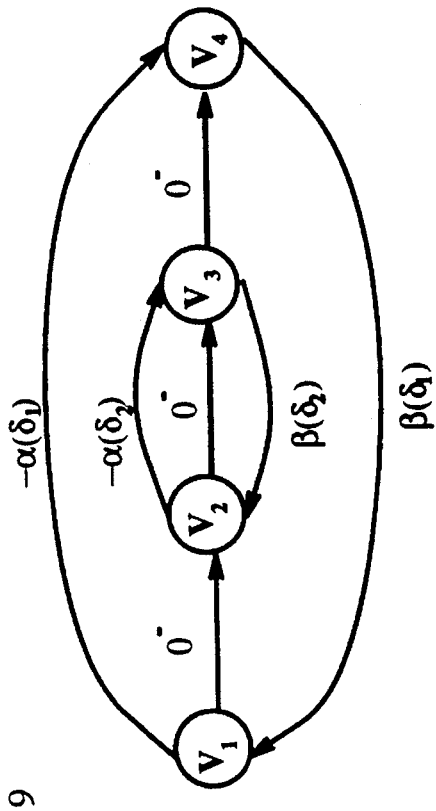

FIG. 9

*Input:* A string $\sigma = x_1, \ldots x_N$.
*Output:* Decides if $\sigma$ is timing consistent, and if so, outputs the reduced graph $G^*(\sigma)$.
*Algorithm:*

Initially: Let $G$ be the graph with a single vertex $v_1$.
For $j := 2$ to $N$ do
{ Comment: $G$ equals $G^*(x_1, \ldots x_{j-1})$.}
1. To $G$, add the vertex $v_j$ and all edges of $G(\sigma)$ that connect $v_j$ with the vertices of $G$.
2. Compute new shortest distances within $G$; if a negative cost cycle is detected, stop ($\sigma$ is timing inconsistent).
3. Remove all the vertices not in $V^*(x_1, \ldots x_j)$.

*Input:* Two strings $\sigma'$ and $\sigma$.
*Output:* Decides if $\sigma'\sigma^\omega$ is timing consistent.
*Algorithm:*

1. If $\sigma'$ is timing inconsistent then stop else compute $G^*(\sigma')$.
2. If $\sigma$ is timing inconsistent then stop else compute $G^*(\sigma)$ (with vertex set $\{v_1, \cdots v_m\}$).
3. Compute $G^*(\sigma^{m^2})$ and $G^*(\sigma^{2m^2})$.
4. Compute the set of pairs $S_{inf}$.
5. Construct $G^*(\sigma^\omega)$ using the rule:
   If $(i,j) \in S_{inf}$ then $d(i,j) = -\infty$ else $d(i,j) = d^{m^2}(i,j)$.
6. Check if $G^*(\sigma')$ connected with $G^*(\sigma^\omega)$ has a negative cost cycle.

TIMING VERIFICATION BY SUCCESSIVE APPROXIMATION

CROSS-REFERENCE TO RELATED APPLICATION

The present invention is a continuation-in-part of Ziv Har'el and R. P. Kurshan, Analytical Development and Verification of Control-Intensive Finite State Machines, U.S. patent Ser. No. 07/489,438, filed Mar. 6, 1990 (now U.S. Pat. No. 5,163,016), and assigned to the same assignee as the present application.

BACKGROUND OF THE INVENTION

1. Field of the Invention

This invention relates to implementations of systems as collections of finite state automata, and more particularly to implementations based on formal verification of the correctness of the system being implemented.

2. Description of the Prior Art

A perennial problem in the design of large systems is verifying that the system will indeed behave in the manner intended by its designers. One approach has been simply to try out the system, either by building and testing the system itself or by building and testing a model of it. In recent years, this approach has taken the form of a computer simulation of the system. A computer program which is a model of the system is written, and the system is tested by executing the computer program. A fundamental problem with the approach of "trying out the system" is that the system's designers can only try out behavior which they anticipate. For any but the simplest systems, however, the designers cannot anticipate all of the behavior of the system, and it is of course always unanticipated behavior which causes difficulties.

As the limitations of stimulation have become more apparent, interest has grown in the formal verification of system behavior. In formal verification, the designer provides a logical definition of the system's intended behavior and a logical definition of the implementation to a formal verification system. The formal verification system then determines whether the logical definition of the system's intended behavior implies the logical definition of the implementation. If it does, the implementation is faithful to the logical definition of the intended behavior.

The system described in the parent of the present application is such a formal verification system. However, that system did not deal with real-time delay constraints on system design. A delay constraint specifies a delay by specifying a delay duration which ranges between a minimum delay duration and a maximum delay duration. The minimum delay duration and the maximum delay duration are termed the lower and upper delay bounds respectively.

For example, the system may be required to respond to a stimulus within a fixed period of time. This fixed period is a first delay constraint with a lower delay bound of 0 and an upper delay bound of the fixed period of time. Further, the stimulus may be received by a first one of the automata making up the system and the response may be provided by another one of the automata. Communication between the two automata is by means of a channel which has a second delay constraint in which the lower delay bound specifies the minimum time required to send a message via the channel and the upper delay bound specifies the maximum delay required to send the message. Clearly, if the lower delay bound of the second delay constraint is longer than the upper delay bound of the first delay constraint, the system will always fail; further, if the upper delay bound of the second delay constraint is longer than the upper delay bound of the first delay constraint, the system will fail whenever the condition of the channel is such that the delay required for the message is longer than the upper delay bound of the first delay constraint.

A technique is known for formally verifying whether a system satisfies a set of real-time delay constraints. This technique is set forth in R. Alur and D. L. Dill, "Automata for modeling real-time systems", in *Automata, Languages, and Programming: Proceedings of the 17th ICALP*, Lecture Notes in Computer Science 443, pp. 322–335, Springer-Verlag, 1990. Unfortunately, there are many cases for which this technique is computationally intractable, and the technique is consequently of limited use in developing implementations of systems. It is thus an object of the invention to provide techniques which are more useful for developing implementations of systems based on formal verification of a system's temporal behavior than those provided by the prior art.

SUMMARY OF THE INVENTION

The foregoing object is achieved by means of an iterative method of verifying that a set of processes, each of which has a delay constraint, satisfies a given temporal property. The method is practised in a computer and includes the following steps:

- determining whether a test set of processed derived from the set of processes satisfies the given temporal property and if the test set does, terminating the method and otherwise providing a counter-example;
- determining whether the counter-example is timing consistent with the delay constraints and if the counter-example is timing consistent, terminating the algorithm; and
- employing the counter-example to restrict the test sets of processes and repeating the steps of the method with the restricted test set as the test set.

Other aspects of the invention include techniques for determining the timing consistency of the counter-example, techniques for finding minimal subsets of delay constraints, and techniques for finding optimal delay constraints, as well as techniques for creating sequential circuits which verify that the sequential circuits satisfy a temporal property.

The foregoing and other objects, aspects, and advantages of the invention will be apparent to one of ordinary skill in the art who peruses the following Drawing and Detailed Description, wherein:

BRIEF DESCRIPTION OF THE DRAWING

FIG. 7 illustrates the structure of the code used in the verification blocks and the signal set that is developed by block 30 of FIG. 2.

FIG. 8 presents an algorithm for timing verification;

FIG. 9 shows how a weighted graph can be used to check timing consistency;

FIG. 10 gives an algorithm for testing timing consistency of finite strings;

FIG. 13 shows an algorithm for testing timing consistency of infinite sequences;

DETAILED DESCRIPTION

The following Detailed Description includes a complete copy of the Detailed Description and Drawings from the parent of the present application. The new disclosure begins with the section entitled *Timing Verification by Successive Approximation* and the new figures begin with FIG. 8.

A TOOL FOR CREATING SOFTWARE CONTROLLED HARDWARE: FIGS. 1–7

As indicated above, this invention deals with the need to create a finite state machine that implements given functions, and to formally verify that the implemented machine carries out the intended functions without fail. This invention realizes the target finite state machine in a program controlled processor or in a specifically designed apparatus. The code which comprises the program that implements the target state machine in a processor, and which dictates the circuit's structure in a hardware embodiment, is developed by the analyzer/developer described hereinafter.

It should be understood at the outset that this invention creates a unique end product, and that is the finite state machine which is developed in accordance with the principles of this invention. This machine has unique properties as described infra. This invention also creates another product, and that is the formally verified specification that is suitable for developing the finite state machine (FSM); whether the FSM is embodied in "conventional" hardware (e.g. integrated circuit) or in software-controlled hardware. In connection with software-controlled embodiments, it should also be recognized that technological efforts have shifted greatly toward the development of control systems in software-controlled hardware, and many worker-hours have been devoted to the software generation effort. Such software generation efforts are greatly benefited by the method of this invention. So, this invention may be properly viewed as a tool for creating software controlled hardware.

Figure 1:
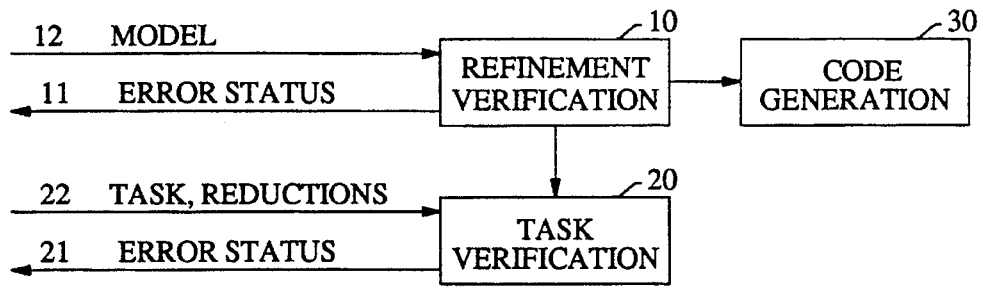
FIG. 1 presents a general block diagram of the analysis/development apparatus of this invention.

Developing a verified design of a finite state machine in accordance with the principles of this invention contemplates an interactive design process. With reference to FIG. 1, which depicts a generalized block diagram of the design analyzer/developer of this invention, the user enters into refinement block 10 a high level specification of the system to be designed. When block 10 determines that the specification contains no internal inconsistencies, the system specification information is passed to verification block 20. Block 20 receives task specifications from the user and formally verifies that the specified tasks are properly executed by the structure defined by the system specification provided by block 10. When an error is detected in blocks 10 or 20, an error message is sent to the user on status lines 11 or/and 21 and the user is given an opportunity to correct the error through input lines 12 and 22. When no errors are detected, the design iteration is completed.

The next iteration is initiated when the user provides more detailed information about the system's specification and identifies a more comprehensive set of tasks that the system must perform. At that time, block 10 analyzes the refinement in the system specification provided by the user to determine that the refined specification is subsumed by the specification verified in the previous iteration. When no errors are detected, the refined specification is passed to block 20, where it is assessed whether the newly specified tasks are properly executed by the structure defined by the refined specification.

Following a number of such iterations, the system specification contained in block 10 is sufficiently detailed and robust to execute all of the necessary tasks. That is, the specification is robust enough to cause all of the expected, or target, outputs to be developed in response to the possible applied inputs. Typically, at that time the design process proceeds to block 30. Block 30 converts the system specification within block 10 to a form that enables the user to construct the designed machine. In today's milieu, that may be a program to be executed on a stored program processor, it may be a collection of logic expressions that define the combinatorial circuit that forms the designed finite state machine. It may also be a net list for constructing a lay-out of an integrated circuit.

Figure 2:
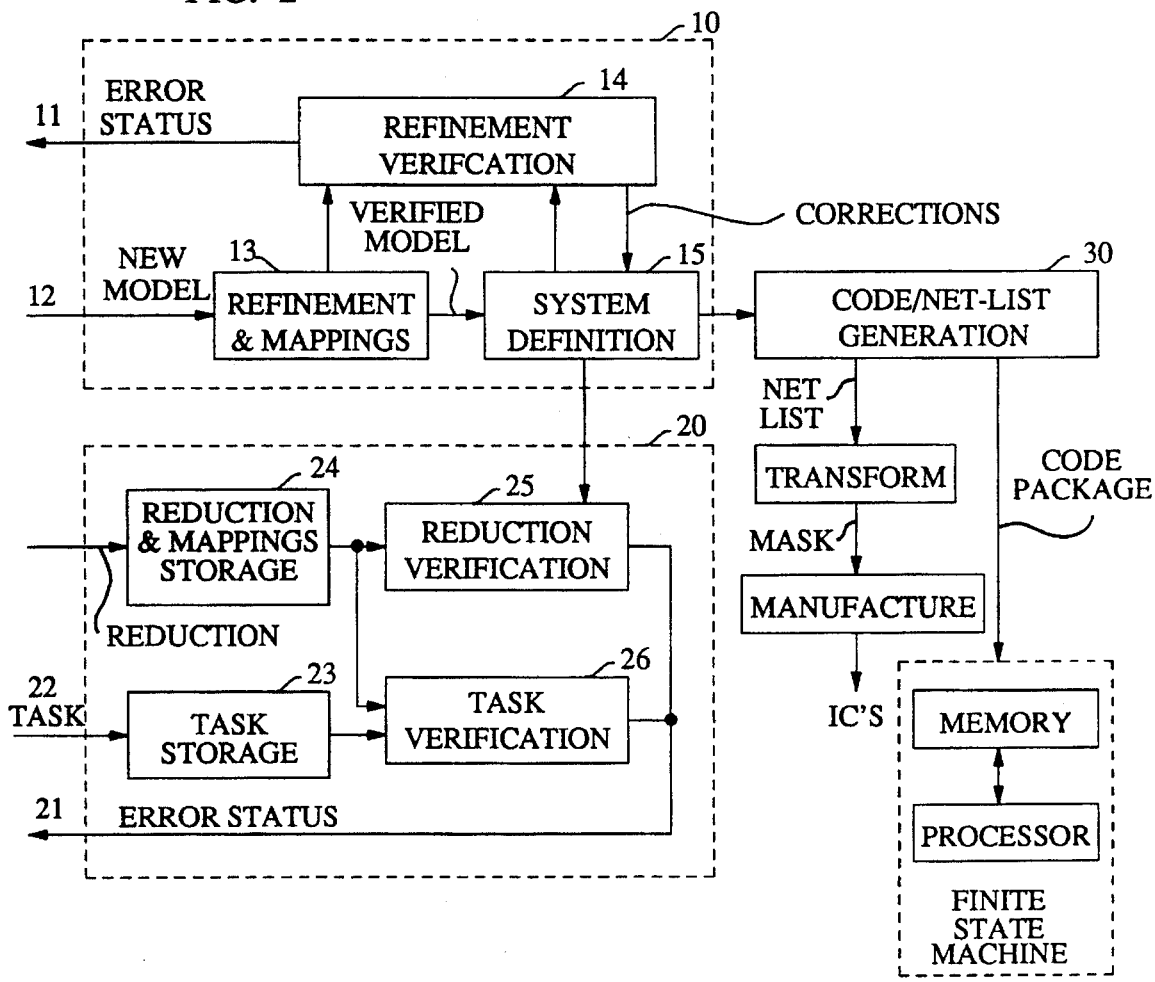
FIG. 2 expands in the block diagram of FIG. 1.

FIG. 2 presents a more detailed description of the FIG. 1 arrangement. Refinement block 10 contains refinement storage block 13, refinement verification block 14 and system definition storage block 15. Blocks 13 and 15 provide signals to block 14 and, in turn, block 14 provides corrections signals to block 15. Block 14 also provides signals to status line 11. In operation, the design process begins with an empty system-storage block 15. The user provides a high level definition of the system to be designed to block 13 and the analysis proceeds. Generally, block 14 analyzes the contents of block 13 to determine that the system definition of block 13 is subsumed by the system definition of block 15. In the first iteration, however, the affirmative conclusion of such analysis is automatic because block 15 is empty. This affirmative conclusion (i.e., the conclusion that the specification is error free) leads block 13 to transfer its contents to block 15 and to send a message on status line 11 that informs the user of the successful conclusion of the current iteration.

When the next iteration is initiated, the user inputs a refined definition of the system into block 13 and a mapping. The mapping maps the states, and actions at the states, of the system specification in block 15 to the states and actions at the states of the system specification in block 13. That is, it maps states to states and actions to actions, as depicted in FIG. 3.

Figure 3:
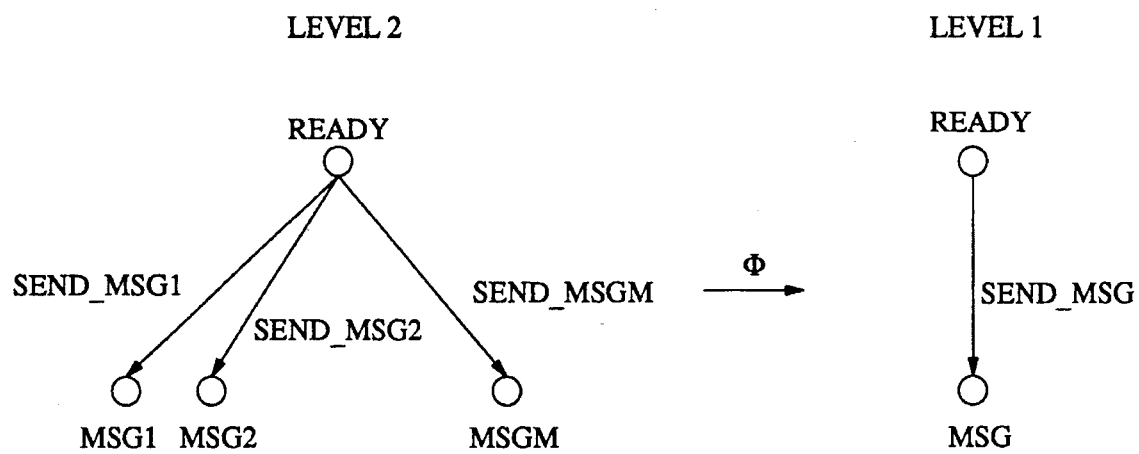
FIG. 3 illustrates the homomorphism concept embodied in the analysis/development approach of this invention.

FIG. 3 shows a portion of the system definition in block 15 as Level 1, and the more refined system definition in block 13 as Level 2. Specifically, Level 1 shows that there is a state "READY" and a state "MSG", an action "SEND-MSG", and a selection of state "MSG" when that action occurs. FIG. 3 also indicates that there exists a mapping Φ from Level 2 to Level 1. Level 2 shows that there is a state "READY" and states "MSG1", "MSG2", . . . "MSGM" which are selected following the actions "SEND_MSG1", "SEND_MSG2", . . . , "SEND_MSGM". The mapping Φ is such that Φ(state in Level 2)=>state in Level 1, and Φ(action in Level 2)=>action in Level 1.

Block 14 analyzes that refined definition and the mapping vis-a-vis the definition contained in block 15. If an error is detected, status line 11 provides a diagnostic message to the user. The user can then correct the refinement contained in block 13 and try again. When no errors are detected, the contents of refinement storage block 13 are transferred through block 14 to system definition storage block 15. The iterative process continues until the system definition in block 15 is detailed enough.

In connection with the inputs to the FIG. 2 arrangement, it should be recognized that there are many ways of defining a system, and that the invention disclosed herein does not depend on that choice. The available choices include boolean expressions, directed graph descriptions, and others. In our implementation, we selected the signal graph approach, which is fairly conventional. In this approach, a system is defined as a collection of process states and transitions between the process states. At each process state, certain selections are possible as a function of the state. Associated with each state transition is an enabling predicate which is expressed in terms of the selections in this process state and other process states with which this process state communicates.

The syntax for describing the system as a collection of process states (nodes) and transitions (edges) forms a data flow language. Such a language includes means for identifying nodes and for identifying the edges. The S/R language, which is modeled after the s/r model of coordination, is the language we use.

The primary formal verification performed in block 14 is the task of determining that every edge in the refined system definition of block 13 maps onto, or corresponds to, exactly one edge in the system definition of block 15. Basically, the task is to go through each edge in the state space representation of the specification in block 14 and determine that, in accordance with the specified mappings, there is a corresponding edge in the state space representation of the specification in block 15. A more detailed description is presented infra.

With each successful conclusion of an iteration within block 10, the specification within block 13 is transferred to block 15, and system definition information within block 15 is communicated to verification block 20. As indicated above, block 20 verifies that the system definition contained in block 15 can properly execute the necessary tasks of the system. The user inputs task definitions into block 23. Block 24 receives from the user reduction information to permit the analysis/development apparatus of FIG. 2 to evaluate whether the tasks are being properly performed. More specifically, the user supplies task definitions to block 23 and reduction mappings to block 24. Each reduction $R_i$ is associated with a task $T_i$. With respect to task $T_i$ the correctness of system operation can be ascertained by determining whether the task is performed by the reduced version as defined by reduction $R_i$.

The reductions of block 24 are verified vis-a-vis the system definition provided by block 15. This verification is performed in reduction verification block 25. The verification is performed on one task at a time. That is, each reduction is tested to determine whether it is a valid reduction, which means that the reduction leaves the operation of the reduced system invariant vis-a-vis the task. Concurrently, the task is tested in block 26 with respect to its reduced system to determine that it can be performed properly. When an error is detected in either block 25 or block 26, status line 21 provides the user a diagnostic message which enables the user to correct the system definition, the tasks define, or the reductions. When no errors are detected, the processing advances to the next task and corresponding reduction mapping, until all tasks pass the tests successfully. The actual testing that is performed in verifying each reduction mapping is the same as the testing performed in verifying the mappings associated with the system refinements (block 14). That is, mathematically, the relationship between the system reduction (relative to some task) and the unreduced system is much like the relationship between the system definition within block 15 and the refined system definition within block 13. As an aside, in some of the literature, these mappings are sometimes referred to as "homomorphisms".

Once the reductions have been verified in block 25, block 26 determines whether each of the specified tasks is properly executed by its reduced system. The verification of block 25 insures that if a task is performed by its reduced system, it is also performed by the unreduced system. Checking the reduced system, of course takes substantially less time. There are many algorithms for checking that a task is performed by a system. One such algorithm is described in an article by R. P. Kurshan titled "Reducibility on Analysis of Coordination", published in Lecture Notes in Computer Science (LNICS) 103 titled Discrete Event Systems: Models and Applications, Springer-Verlag, pp. 19–39, (1987). As an aside, in some of the literature, these algorithms are sometimes referred to as "language containment" algorithms.

When all of the tasks have been analyzed successfully, status line 21 informs the user that the iteration is complete. Thereafter, the user advances to the next iteration. The user provides a refinement of the system (to block 10), defines a more comprehensive set of tasks to be performed by the refined systems and reductions for testing the new set of tasks.

As described above, the arrangement of FIG. 2 carries out the testing functions, and the successful end result is a specification within block 15 that is as detailed as necessary for carrying out all of the specified tasks; i.e. all of the target output signal can be developed for the various possible input signals. At this time code generator 30 is engaged to develop explicit code for implementing the finite state machine. This code can be targeted for installation into a stored program controlled processor that would embody the finite state machine, or it can be code that forms an input to a step of developing the necessary information for a special purpose hardware realization. Such information, for example, can be a "net list" that defines the connections between various elements of an integrated circuit embodiment. The net list can be used directly to build the target FSM, or it can be transformed to one or more masks that are used to manufacture integrated circuits that realize the target FSM.

Before providing additional details regarding the verifications performed in blocks 14, 25 and 26, a generalized example of the above-described principles may be beneficial.

Figure 4:
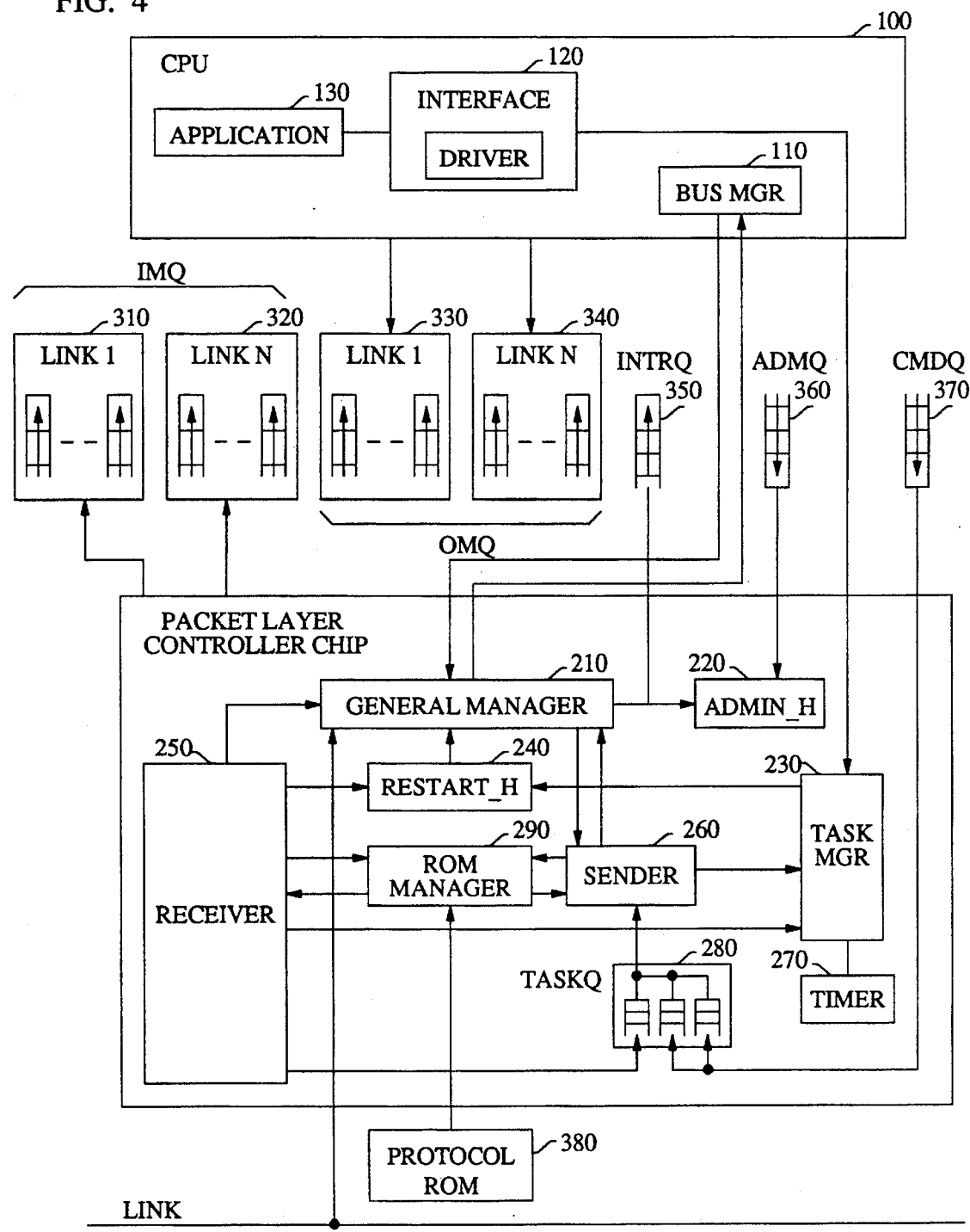
FIG. 4 presents an example of a protocol apparatus and the task-relative reductions that may be applied.

FIG. 4 presents a block digram of a controller whose design is to be formally developed and verified in accordance with the principles of this invention. It includes, a CPU 100 and a packet layer controller (PLC) 200. CPU 100 includes a bus manager 110, interface driver 120 and applications 130. PLC 200 includes a general manager 210, an administration block 220, a task manager 230, a restart block 240, a receiver 250, a sender 260, a timer 270, a tasks queue block 280, and a ROM manager 290. Associated with the PLC are incoming and outgoing queues 310–370 and a protocol ROM 380.

One of the tasks that applications block 130 needs to have executed is an "enque-msg" task wherein the application outputs an "enque-msg" token and puts a message on an output message queue, e.g. queue 330. The "enque-msg" token is interpreted by driver 120 and sent to command queue 370. At the same time task manager 270 is informed of the insertion of the interpreted token into the command queue. The task manager picks the queued message off the command queue, brings it down to task queue 280, and from there send it into sender 260. The sender gets access to the protocol in ROM 380, through ROM manager 290 and general manager 210. General manger 210 controls conflicts in the ROM and in the system bus which does the processing of the "enque-msg" task in accordance with the protocol. It eventually succeeds in moving the data from the output message queue down to the link.

In order to verify this task, it is necessary to reduce the complexity of the FIG. 4 system because the system is too complicated. That is, as it stands, there are too many states that the system may assume to permit an efficient verification (from the standpoint of computation effort). Hence, the reduction step described above. The aim of the reduction is to abstract the portions of the system which aren't involved the interaction with the "enque-msg" task and to reduce those portions to a much simpler set of blocks which interact with the job of the sender and the other components but which is not otherwise proactive in connection with the task at hand. As long as their interaction or interfering is at least as great as the interaction of the real components, a proof that the "enque-msg" task is performed with the reduced system is also a guarantee that the task will be performed with the unreduced system. One possible reduction, for example, may encompass blocks 310, 320, 350, 360, 220, 270, 240, 250, and 290. On the other hand, it may turn out that even such a drastic reduction may not be encompassing enough.

One solution that can be employed is to decompose the "enque-msg" task into three subtasks. The first subtask may be to verify that when the application sends an "enque-msg", that the "enque-msg" token reaches the command queue. The second subtask may be to verify that, assuming the "enque-msg" token is somehow in the command queue, the task manager pulls it down properly to the sender. The third subtask may be to show that, assuming the "enque-msg" token is in the sender, the sender properly performs the data transfer to the link. To prove each of these subtasks, a much larger portion of the system may be encompassed in the reduced blocks. The resulting simpler system can then be analyzed and the subtasks proven more easily. Of course, there is an additional verification step that must be undertaken and that is to prove that performing the subtasks is tantamount of performing the original "enque-msg" task.

Returning to the verification performed in block 14, as indicated above, the relationship between the system specification in block 15 and the more refined system specification in block 13 is defined by a mapping (homomorphism). To verify that the refined, more complex, specification is consistent with the less complex specification, it is necessary to test that whenever there is a transition from a state v to a state w in the more complex system which is enabled by a selection x and under the above mappings, v maps to v', w maps to w' and x maps to x', then the transition form v' to w' is enabled by x' (v', w' and x' relating to the less complex system).

The s/r model is employed to make the above evaluations. In simple terms, the s/r model may be explained by considering a global selection, a global state, and a multiplicity of component finite state machines that coordinate to form the overall finite state machine. At each iteration of this model, each of the component finite state machines selects an output from among the outputs that are possible from its current state, and thus contributes to the global section. It then observes the global selection and moves to a next state to which the finite state machine may go. These iteration scan continue ad infinitum.

We implement the s/r model for verification purposes in what we call the "crank machine". It includes a multiplicity of modules that correspond to the multiplicity of coordinating component finite state machines, and means for iterating through four steps. In addition to the two steps described above of making a selection and resolving to a state (which form steps 2 and 3 of the crank machine), the crank machine includes a first step of unpacking a global state from a register and applying it to the component state machines, and a fourth step of packing the new global state and storing it in the register. The register serves as a communications interface between the component finite state machines, which provides for the interaction that is necessary between the component finite state machines. Each of the component finite state machines is responsive to the global state, and each of the finite state machines contributes to the creation of the next global state.

Of course, having the mere capability to cycle through various states of the system specification is insufficient for the purpose of testing the system specification. Means must to be provided to actually cycle through all of the possible states and selections. It should be kept in mind that a system can have several selections when it is in a given state and, conversely, for each selection there can be resolution to one of several states.

Figure 5:
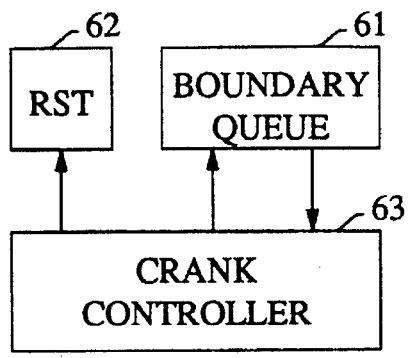
FIG. 5 presents a general block diagram of our embodiment of a "crank machine"

To test a system specification, we employ a boundary queue memory 61, a reached state table (RST) 62, and a crank machine controller 63, as shown in FIG. 5. The boundary queue is a stack that can be accessed from the top or the bottom, and it contains a list of global state pointers that point to states of the system within the RST. The crank machine controller (a software controlled processor) pops a state from the top of the boundary queue, unpacks the state and applies it to various modules that represent the component finite state machines. It then generates all of the possible selections, and for each selection generates all of the possible next states. With respect to each generated next state, the crank machine determines whether that state is already in the RST. If it's not in the RST, the crank machine adds the state to the RST and inserts a pointer in the boundary queue that points to the location of the inserted state in the RST. The pointer is inserted at the top of the boundary queue stack or at the bottom of the boundary queue stack, depending on the value of an acceptance criterion. More particularly, the pointer is inserted at the top of the stack when it is determined that access to the state was across a "recur" edge. This concept is found in the aforementioned LNICS paper by R. P. Kurshan.

Figure 6:
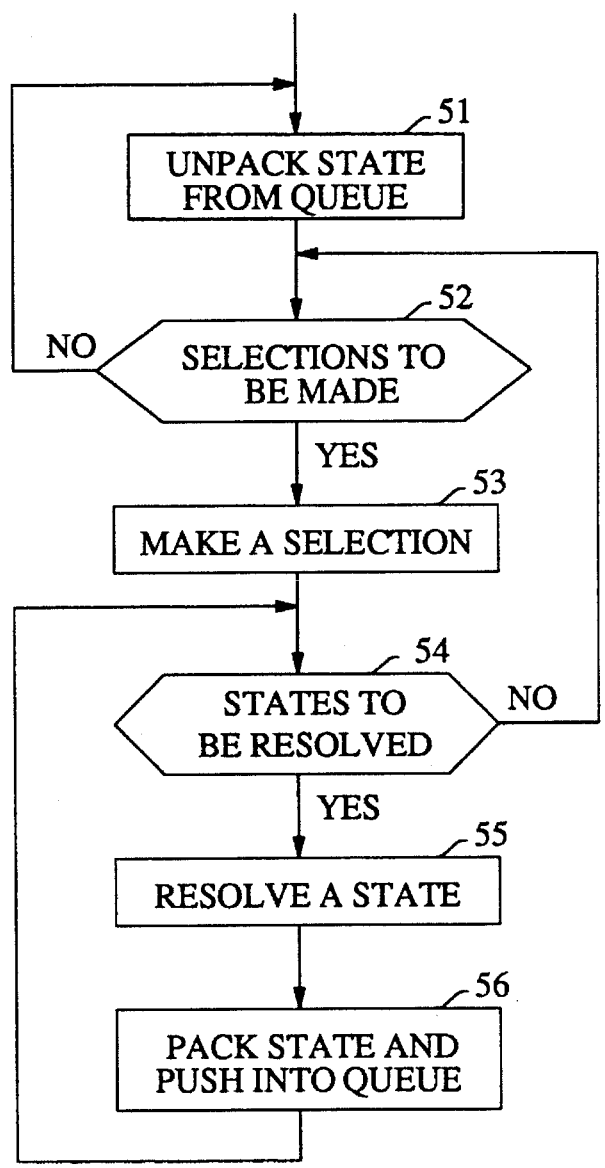
FIG. 6 depicts a flow chart for cycling through selections and states.

The above-described process follows basically the flow of FIG. 6. In block 51, the state is unpacked from the buffer queue. In block 52, a determination is made whether there are selections to be made in the system which have not been made previously. When the answer is affirmative, a selection is made in block 53 and control passes to block 55. Otherwise, control passed back to block 51 where another system state is popped from the stack and unpacked by the crank machine.

In block 54 a determination is made whether there are states to which the system can move (based on the section made) which haven't been identified before. When the answer is affirmative, block 55 resolves to that state and block 56 packs the resolved state and pushes it onto the boundary queue stack. When no additional states can be resolved, control passes back to block 52 to make another selection.

Block 56 in FIG. 6 includes the logic for determining whether to push the packed state into the top of boundary queue stack 61 of into it bottom. Block 52 includes the logic for cycling through the various selections that are made by the component finite state machines.

The modules within the crank machine controller correspond to the component finite state machines. In accordance with our invention, these modules are created by compiling the S/R language specification. Our compiler creates a code that converts the specification to a collection of switch action statements with a structure as outlined in the C-like code of FIG. 7. FIG. 7 is merely illustrative and it is not intended to be exact. For the illustrative purposes herein, FIG. 7 includes the "set state vector" construct to mark the effort of blocks 52 and 54 in connection with the cycling through all possible selections and all possible states that exist in the case statements that follow. FIG. 7 also includes a companion error statement with each of the action statements. The error statement entries represent the testing that is performed to effect the desired verification. One such testing is the stability testing. To test stability, one must determine that the specification is consistent with a continuous time asynchronous system definition. It should be kept in mind that FIG. 7 represents only one component finite state machine and that the states and selections discussed above relate to global selections and global states.

The above describes the process of cycling through the various states that are possible and the various selections that are available. To perform the verification of block 14, the above process is applied to both, the specification of block 13 and the specification of block 15. The process is applied to both system simultaneously and at each step a determination is made to ascertain that when the system of block 13 experiences a transition from a state v to a state w which is enabled by a selection x, and the system of block 15 experiences the transitions from v' to w' in accordance with selection x', that v', w' and x' are related to v, w, and x by the mapping of block 13.

As indicated above, the verification process associated with block 25 is identical in kind to the verification process of block 14 and, therefore, for the sake of brevity, no more is said about it.

As for the code generator (block 30), it develops basically the same collection of switch statements that are created in the verification process of block 14. The only difference is that the testing submodules that are incorporated in the switch statements to cycle through all the possible states, for example, are removed. Also removed, of course, are the "error statements" entries of the FIG. 7 illustration. The result is that the code generator develops a code that has no calls to functions or subroutines. All of the decisions are made on one "level" of the switch statement. The results is that when the signals set that corresponds to the code package developed by the code generator is installed in a target machine (processor - memory combination) the resulting finite state machine is extremely fast. The difference between the finite state machine that is created with the signal set of code generator 30 and finite state machines developed by other means is akin to the difference in speed between a multiplier that comprises a processor that calculates products in accordance with some algorithm and a multiplier that comprises a look-up table (with the finite state machine of this invention being more like the look-up table).

Still, without more, the code generated by block 30 would comprise a collection of finite state machines. A still better product results, in accordance with our invention, by merging various subsets of the individual finite state machines into respective single one's. Practically, that means combining a number of switch statements into a single switch statement. Accomplishing such merging is not difficult; one needs only to realize of its effect, which is to decrease execution time at the possible expense of increased memory in software.

This effect of code lengthening in consequence of merging may be ameliorated by another step carried out in block 30, and that is a step of relative reduction on each of the various merged machines. The concept of reduction is not new. Conventional finite state machine reduction algorithms look at all possible input values and reduce the system to allow it to respond to those possible inputs. The reduction occurs by virtue of the limitation on the possible inputs. See J. E. Hopcroft in "An n log n Algorithm for Minimizing the States in a Finite Automaton", Theory of Machines and Computations, (Kohavi, Paz, eds.) Academic Press, pp. 189–196. Our reduction is improved in that we look at the possible inputs at the various states of the FSM. Since not all inputs are possible at all of the states, the reduction that we achieve by considering individual states may be substantially greater than that which is available conventionally.

In summary, the way the analyzer/developer structure works is that the user specifies the general architecture, functionality for the components, and the tasks. The analyzer/developer then verifies that the tasks can be performed and allows the user to iteratively refine the system definition and the tasks to be performed by the refined system.

The difference between the top-down stepwise refinement approach of this invention and the conventional development approach is that the conventional development approach creates modules, one at a time, with complete functionality within each module. As new modules are added, new behaviors are added to the system. In accordance with this invention, on the other hand, the entire system is defined ab initio;; first at a very abstract level and then at levels of increasing detail. Because at the highest level the system is very abstract, low level questions such as pertaining to checking correctness of the syntax of a datum, are left nondeterministic. For example, at the high level of specification a particular message could nondeterministically have good syntax or bad syntax. Both are possible. This is refined in subsequent levels to a system in which the syntax is defined and checked to yield the condition that a particular message will have either good syntax or bad syntax, but not both.

Viewed still differently, in accordance with this invention behaviors are removed rather than added. This distinction is particularly salient because when one expects to be able to prove something about the system as it is being developed, it is not possible to prove something about the behavior of a system when behaviors are added. The reason for that is that when something is proven about a component and then behaviors are added, it is no longer possible to know whether the previously proven proposition still holds. On the other hand, when behaviors are removed and it has been proved that all the behaviors of the abstract system are satisfactory, then it certainly remains true about the refined system of fewer behaviors. As a result, one important benefit of the approach of this invention is that it enables the user to detect fundamental designer errors at a very early time in development rather than having to wait until the full instantiations of all the elements of all the components is complete.

TIMING VERIFICATION BY SUCCESSIVE APPROXIMATION

The following discussion begins with an overview of the problem of verification of coordinating processes with delay constraints and then addresses portions of the problem described in the overview in more detail.

Overview

We address the problem of automata-theoretic verification of coordinating processes, in the case that the coordinating processes have certain associated events understood as "delays", and these delays are constrained by lower and upper bounds on their allowed duration in time.

Given a "system" modeled by an $\omega$-automaton M, and a temporal property modeled by an $\omega$-automaton T, we want to verify that M has the property T, or more precisely, that the language inclusion $\mathcal{L}(M) \subseteq \mathcal{L}(T)$ holds. The language $\mathcal{L}(M)$ can be understood as the set of "behaviors" possible in the system M, while $\mathcal{L}(T)$ can be interpreted as the set of all behaviors consistent with the property T.

While our development here is fairly general, we make one basic requirement on the semantic nature of the automata used to model the system (M above). We require that the automata (over a common alphabet) are closed under a composition operator, denoted by $\otimes$ supporting the language intersection property:

$$\mathcal{L}(\otimes N) = \mathcal{L}(M) \cap \mathcal{L}(N). \quad (1)$$

We will refer to any such class of automata as processes. Examples of process classes are L-processes, described in R. P. Kurshan, "Reducibility in analysis of coordination", in *Lecture Notes In Computer Science*, vol. 103, pp. 19–39, Springer-Verlag, 1987, and R. P. Kurshan, "Analysis of discrete event coordination", in *Lecture Notes In Computer Science*, vol. 430, pp. 414–453, Springer-Verlag, 1990, with composition defined by the tensor product, deterministic Muller automata, described in Y. Choueka, "Theories of Automata on $\omega$-ta;es: a simplified approach", in *Journal of Computer and System Sciences*, 8:117–141, 1974, and deterministic Rabin-Scott acceptors (conventional automata accepting strings) with composition defined by the Cartesian product (more precisely, the $\wedge$ operator defined in R. P. Kurshan, supra 1987. Such processes support models of both synchronous and asynchronous coordination, including interleaving semantics (see R. P. Kurshan, supra 1990).

A "system" M is commonly defined in terms of coordinating components, each component restricting the behavior of the other components with which it coordinates. Therefore, processes provide a natural class of automata for modeling such coordination. We make further use of this property when we consider processes subject to timing constraints: the timing constraints not only constrain the process itself, but also the other processes with which it coordinates.

While we impose no requirements of associativity on $\otimes$, in the following development, for simplicity, we will write successive compositions without parentheses. Furthermore, we assume that if $\Sigma$ is the underlying alphabet, then there exists a process 1 with $\mathcal{L}(1) = \Sigma^+$ or $\mathcal{L}(1) = \Sigma^\omega$, where $\Sigma^+$ is a language over the alphabet $\Sigma$ which consists of strings, i.e., finite words, and $\Sigma^\omega$ is a language over $\Sigma$ which consists of sequences, i.e., infinite words.

In this paper we address the issue of verification subject to timing constraints imposed upon the component processes. We begin with a system model P expressed as a composition of processes: $P = \otimes_{i=1}^K P_i$, with no reference yet to timing constraints. Next, suppose that certain events $x \in \Sigma$ correspond to the beginning or the end of a "delay event" relative to various $P_i$. Specifically, for each $P_i$ we are given a finite set $\Delta_i$ of delays; let $\Delta_P$ be $\cup_i \Delta_i$. The association between the events in $\Sigma$ and the delays is given, for each $P_i$, by two partial functions $b_i$ ("begin") and $e_i$ ("end"), mapping some of the vents in $\Sigma$ to the delays in $\Delta_i$. For an event $x \in \Sigma$, if $b_i(x) = \delta$, then this means that process $P_i$ begins delay $\delta \in \Delta_i$ at event x, and if $e_i(x') = \delta$ then $P_i$ ends this delay at x'. For example, x may correspond to the receipt of a signal by $P_i$, marking the onset of an internal delay $\delta \in \Delta_i$: $b_i(x) = \delta$; or, x may correspond to the subsequent emission of a signal from $P_i$ marking the end of that delay: $e_i(x) = \delta$. If process $P_i$ did not begin a delay at event x, then $b_i(x)$ is undefined; likewise for $e_i(x)$. If processes $P_i$ and $P_j$ both begin a delay at event x, then $b_i(x) \in \Delta_i$ and $b_j(x) \in \Delta_j$ are defined. For example, x may correspond to the simultaneous receipt of a signal by $P_i$ and emission of a (perhaps unrelated) signal from $P_j$. For more examples of how this arises naturally in modeling systems of concurrent processes, see the Kurshan 1987 and 1990 references cited above.

Now, recall that the verification problem is to prove $\mathcal{L}(P) \subseteq \mathcal{L}(T)$ for some process T. However, it may be the case that while $\mathcal{L}(P) \not\subseteq \mathcal{L}(T)$, it nonetheless holds that $\mathcal{L} \subseteq \mathcal{L}(T)$ for the subset $\mathcal{L} \subset \mathcal{L}(P)$ which is consistent with timing constraints we impose on the delays. Specifically, suppose that each delay $\delta \in \Delta_P$ has associated with it two nonnegative numbers: $0 \leq \alpha(\delta) \leq \beta(\delta)$ where $\alpha(\delta)$ is rational and $\beta(\delta)$ is rational or is $\infty$. The intended interpretation is that the delay $\delta$ has duration at least $\alpha(\delta)$ and at most $\beta(\delta)$. A delay constraint is 3-tuple $D = (\Delta, \alpha, \beta)$ where $\Delta \subseteq \Delta_P$. Now we define the notion of timing consistency:

A sequence $x \in \mathcal{L}(P)$ is timing-consistent with respect to a delay constraint $D = (\Delta, \alpha, \beta)$, provided there exist real numbers $t_1 < t_2 < \ldots$ such that for all processes $P_i$, and any $\delta \in \Delta \cap \Delta_i$, if $b_i(x_j) = \delta$, $e_i(x_k) = \delta$ for $k > j$ and both $b_i(x_l)$ and $e_i(x_l)$ are undefined for $j < l < k$, then $\alpha(\delta) \leq t_k - t_j \leq \beta(\delta)$.

In other words, x is timing-consistent if it is possible to assign an increasing succession of real times to the events of P modeled by x, in such a way that the durations of delays of the respective component processes $P_i$ as given by these time assignments are within the allowed bounds. For any delay constraint D, let $$\mathcal{L}_D(P) = \{x \in \mathcal{L}(P) | x \text{ is timing-consistent with } D\}.$$

For convenience, we define any string $\sigma = (x_1, \ldots, x_n)$ to be timing-consistent (with D) provided there are real numbers $t_1 < \ldots < t_n$ satisfying these same conditions.

We week an algorithm to answer the language inclusion question $$\mathcal{L}_D(P) \subseteq \mathcal{L}(T) \quad (2)$$

for $D=(\Delta_P,\alpha,\beta)$. Such an algorithm is already known, because using the method explained in R. Alur and D. L. Dill, "Automata for modeling real-time systems", in em Automata, Languages, and Programming: Proceedings of the 17th ICALP, Lecture Notes in Computer Science 443, pp. 322–335, Springer-Verlag 1990, we can construct an automaton $P_D$ which rules out timing-inconsistent sequences; that is, $\mathcal{L}(\otimes P_D)=\mathcal{L}_D(P)$. Unfortunately, the size of $P_D$ is exponential in the number of processes comprising P and is proportional to the magnitudes of the bounds given by $\alpha$ and $\beta$. Furthermore, it was shown there that this problem is PSPACE-complete. The purpose of this paper is to develop a heuristic for circumventing this computational complexity. Our heuristic works like this. We first try to prove the language inclusion $$\mathcal{L}(P) \subseteq \mathcal{L}(T) \quad (3)$$

If this succeeds, then surely (2) holds, as $\mathcal{L}_D(P) \subseteq \mathcal{L}(P)$. IF (3) fails, then for some $x \in \mathcal{L}(P)$ $x \notin \mathcal{L}(T)$.

Let us first consider the case that the counter-example x has a finite prefix $\sigma$ such that every extension of $\sigma$ does not belong to $\mathcal{L}(T)$. This is the case, for instance, when the temporal property defined by T is a "safety" property. The problem of testing consistency of $\sigma$ can be reduced to the problem of finding negative cost cycles in a weighted graph as described in the next section. In this case, the timing-consistency of x can be checked in time $O(|\sigma| \cdot K^2)$, where K is the number of processes. For the general case with x infinite (e.g., T specifies a "liveness" property) we can find a counter-example x of the form $x = \sigma' \sigma^\omega$ for strings $\sigma$ and $\sigma'$. The algorithm for testing consistency of x in this case is of time complexity $O((|\sigma'|+|\sigma|) \cdot K^2 + K^3 \cdot \lceil \log K \rceil)$.

If x is timing-consistent, then x provides a counter-example to (2). Otherwise, we identify first a minimal set of processes, and for those, a minimal set of delays $\Delta_1$, giving a delay constraint $D'=(\Delta_1,\alpha,\beta)$ with respect to which x is not timing-consistent. Next, we relax the delay bound maps $\alpha$ and $\beta$ by decreasing respective $\alpha(\delta)$'s and increasing $\beta(\delta)$'s, in a fashion which preserves the non-timing-consistency of x but which, after dividing each bound by their collective greatest common divisor, results in bounds which are as small as possible. The result of these operations gives an "optimized" delay constraint $D_1$ with respect to which x is timing inconsistent. Using an algorithm from the Alur and Dill reference mentioned above, we generate a process $P_{D_1}$ such that $\mathcal{L}(P_{D_1})=\mathcal{L}_{D_1}(1)$, where 1 is a process satisfying $\mathcal{L}(1)=\Sigma^\omega$. We apply state minimization to $P_{D_1}$, getting $E_1$ with $\mathcal{L}(E_1)=\mathcal{L}_{D_1}(1)$. If $D_1$ involves only a few processes, then the size of $E_1$ is small. In fact, experience suggests that in typical cases, only a few delay bounds are material to the verification of any specific property T, especially in case T is a "local" property (derived, perhaps, through decomposition of a global property—see the 1990 Kurshan reference).

We test the language inclusion $$\mathcal{L}(\otimes E_1) \subseteq \mathcal{L}(T) \quad (4)$$

and proceed as before, either verifying (4) and thus (2), or finding a counter-example x to (4). In the latter case, either x is a counter-example to (2), or it is not timing-consistent. In this last case, we find a set of delays $D_2$ as before, with respect to which x is not timing-consistent, and generate an $E'_2$ with $\mathcal{L}(E'_2)=\mathcal{L}_{D_2}(1)$. We minimize $E_1 \otimes E'_2$ giving $E_2$, and test $\mathcal{L}(\otimes E_2) \subseteq \mathcal{L}(T)$.

The outline of the algorithm is shown in FIG. 8. Note that as $\Delta_P = \cup \Delta_i$ is finite, there are only finitely many choices for $\Delta(x)$ at step 4. The optimization heuristic used at step 5 can construct only a finitely many choices of the bounding functions $\alpha'$ and $\beta'$ for a given set $\Delta(x)$ of delays. This guarantees termination. To ensure faster convergence, $\alpha$ and $\beta$ are optimized only once for a specific choice of $\Delta(x)$. With this restriction, this algorithm terminates in at most $n=2^{|\Delta_P|}$ steps, in the worst case generating $E_1, \ldots, E_n$ with $$\mathcal{L}(P) \supset \mathcal{L}(\otimes E_1) \supset \mathcal{L}(\otimes E_2) \supset \ldots \supset \mathcal{L}(\otimes E_n) = \mathcal{L}_D(P). \quad (5)$$

CHECKING TIMING CONSISTENCY

In this section, we address the problem of checking timing consistency of x with respect to a delay constraint $D=(\Delta,\alpha,\beta)$.

A Graph-theoretic Formulation of the Problem

Consider a sequence $\sigma = x_1 x_2 \ldots$. Recall that $\sigma$ is timing consistent with respect to D if and only if we can assign "time" values $t_i$ to the respective events $x_i$ such that 1. $t_1 < t_2 < \ldots$, and
2. if process $P_i$ begins a delay $\delta \in \Delta$ at $x_j$ (i.e., $b_i(x_j)=\delta$), and the matching end is at $x_k$ (i.e., $e_i(x_k)=\delta$ and both $b_i(x_l)$ and $e_i(x_l)$ are undefined for $j < l < k$), then $$\alpha(\delta) \leq t_k - t_j \leq \beta(\delta).$$

Checking feasibility of this system of inequalities can be reduced to detecting negative cost cycles in a weighted graph. Let us first consider an example.

Example 1 Consider two processes $P_1$ and $P_2$. The process $P_1$ has a delay $\delta_1$, and the process $P_2$ has a delay $\delta_2$. Let $b_i$ and $e_i$ denote the beginning and ending of the respective delays of $P_i$. Consider the string $\sigma = (b_1, b_2, e_2, e_1)$. Checking consistency of $\sigma$ corresponds to testing consistency of the following set of inequalities:

$$t_1 < t_2 < t_3 < t_4, \quad \alpha(\delta_1) \leq (t_4-t_1) \leq \beta(\delta_1), \quad \alpha(\delta_2) \leq (t_3-t_2) \leq \beta(\delta_2).$$

The graph associated with these inequalities is shown in FIG. 9. The graph has a node $v_i$ for each $t_i$, and each inequality gives rise to an edge. Thus, the constraint $\alpha(\delta_1) \leq (t_4-t_1) \leq \beta(\delta_1)$ gives rise to two edges: a forward edge from $v_1$ to $v_4$ with weight $-\alpha(\delta_1)$ and a backward edge from $v_4$ to $v_1$ with weight $+\beta(\delta_1)$. Similarly the constraint $\alpha(\delta_2) \leq (t_3-t_2) \leq \beta(\delta_2)$ gives rise to two edges. For every constraint $t_i < t_{i+1}$, i.e. $t_i - t_{i+1} < 0$, there is an edge from $v_i$ to $v_{i+1}$ with weight $0^-$. The superscript "–" indicates that, on account of the strict inequality, nonzero time must have elapsed.

The cost of a cycle is the sum of the costs of its edges. While adding the costs we need to account for the superscripts also: the sum of two costs has the superscript "–" iff one of the costs has the superscript "–". It is easy to see that the string $\sigma$ is timing inconsistent iff the graph has a negative cost cycle (the cost $0^-$ is considered to be negative). Assuming $\alpha(\delta_1) \leq \beta(\delta_1)$ and $\alpha(\delta_2) \leq \beta(\delta_2)$, the graph has a negative cost cycle iff $\alpha(\delta_2) \geq \beta(\delta_1)$. Note that if $\alpha(\delta_2)=\beta(\delta_1)$, then there is a negative cost cycle with cost $0^-$.

The Domain of Bounds

The above example illustrates that the cost of an edge reflects whether the corresponding constraint is a strict or a nonstrict inequality. In order to deal with different types of bounds uniformly, we define the domain of bounds in a fashion similar to that found in D. L. Dill, "Timing Assumptions and verification of finite-state concurrent systems", in:

J. Sifakis, editor, *Automatic Verification Methods for Finite State Systems*, Lecture Notes in Computer Science 407, Springer-Verlag, 1989, to be the set $$\mathcal{B} = \{\ldots -2, -1, 0, 1, 2, \ldots\} \land \{\ldots -2^-, -1^-, 0^-, 1^-, 2^-, \ldots\} \cup \{-\infty, \infty\}.$$

The costs of the edges of the graph will be from the domain $\mathcal{B}$. To compute shortest paths, we need to add costs and compare costs. The ordering $<$ over the integers is extended to $\mathcal{B}$ by the following law: for any integer $\alpha$, $-\infty < a^- < a < (a+1)^- < \infty$. The addition operation $+$ over integers is extended to $\mathcal{B}$ by: (i) for all $b \in \mathcal{B}$ $b + \infty = \infty$, (ii) for all $b \in \mathcal{B}$, with $b \neq \infty$, $b + (-\infty) = -\infty$, and (iii) for integers $a$ and $b$, $a + b^- = a^- + b = a^- + b^- = (a+b)^-$.

Now the constraints corresponding to a sequence $\sigma$ can be rewritten as follows. A constraint of the form $t_i < t_{i+1}$ is written as $t_i - t_{i+1} \leq 0^-$. A constraint of the form $a_1 \leq t_k - t_j \leq b_1$ gives rise to two constraints: $t_k - t_j \leq b_1$ and $t_j - t_k \leq -a_1$.

The Weighted Graph G(x)

For a sequence x, now we define an infinite weighted graph $G(x)$, where the costs of the edges are from the set $\mathcal{B}$, as follows. The graph $G(x)$ has a node $v_i$ for every variable $t_i$; for each constraint $t_j - t_k \leq b$, $b \in \mathcal{B}$, there is an edge from $v_j$ to $v_k$ with cost b. Thus if a process begins its delay at $x_i$ with a matching end at $x_j$, then the graph has a forward edge from $v_i$ to $v_j$ with negative cost showing the lower bound and a backward edge from $v_j$ to $v_i$ with positive cost showing the upper bound. The problem of checking consistency reduces to finding negative cost cycles in this graph:

Lemma 1 The sequence x is timing inconsistent iff the graph $G(x)$ has a negative cost cycle.

For a string $\sigma$ of length N, a weighted graph $G(\sigma)$ with N vertices is defined similarly, and the corresponding lemma holds as well.

Testing Consistency of Strings

For a string $\sigma$ of length N, the graph $G(\sigma)$ is finite with N vertices and $O(N \cdot K)$ edges, where K is the number of processes. There exist standard polynomial-time algorithms to detect negative cost cycles. However, the best known time complexity is $O(N^2 \cdot K)$. Since N is much larger than K, we prefer an alternative solution with time complexity $O(K^2 \cdot N)$.

The Reduced Graph $G^*(\sigma)$

Consider a string $\sigma = x_1 x_2 \ldots x_N$. The graph $G(\sigma)$ has N vertices $v_1, v_2, \ldots v_N$. Let $V^*_b(\sigma)$ consist of vertices $v_j$ such that some process $P_i$ finishes a delay $\delta$ at $x_j$ with no prior matching beginning of the delay (i.e., $e_i(x_j) = \delta$ and for all $1 \leq k < j$, both $b_i(x_k)$ and $e_i(x_k)$ are undefined). Similarly, let $V^*_e(\sigma)$ consist of vertices $v_j$ such that some process $P_i$ begins a delay $\delta$ at $x_j$ and there is no matching end of the delay (i.e., $b_i(x_j) = \delta$ and for all $j < k \leq V$, both $b_i(x_k)$ and $e_i(x_k)$ are undefined). Let $V^*(\sigma)$ be the union of $V^*_b(\sigma)$ and $V^*_e(\sigma)$. Observe that the size of $V^*(\sigma)$ is at most 2K. Now consider a superstring $\sigma'$. Clearly, the graph $G(\sigma)$ is a subgraph of $G(\sigma')$. A vertex in the subgraph $G(\sigma)$ has an edge going out of this subgraph only if this vertex is in $V^*(\sigma)$. Thus the vertices not in $V^*(\sigma)$ are "internal" to the subgraph $G(\sigma)$.

From the graph $G(\sigma)$ let us define another weighted graph $G^*(\sigma)$, called the reduced graph of $\sigma$, as follows: the vertex set is $V^*(\sigma)$, and for every pair of vertices $v_j$ and $v_k$ in $V^*(\sigma)$ there is an edge from $v_j$ to $v_k$ with cost equal to the cost of the shortest path from $v_j$ to $v_k$ in the graph $G(\sigma)$ (note that this cost can be $\infty$ if there is no path from $v_j$ to $v_k$, and can be $-\infty$ if there is no "shortest" path because of a negative cost cycle). Thus, the graph $G^*(\sigma)$ is obtained from $G(\sigma)$ by first computing the shortest paths and then discarding the internal vertices. Thus, if we replace the subgraph $G(\sigma)$ by $G^*(\sigma)$ in $G(\sigma')$, the resulting graph has a negative cost cycle iff $G(\sigma')$ does.

Constructing the Reduced Graph

Using these ideas, the consistency of strings can be checked efficiently using a dynamic programming approach. The outline of the algorithm is shown in FIG. 10. Given a string $\sigma$, it checks if the graph $G(\sigma)$ has a negative cost cycle, and if not, computes the reduced graph $G^*(\sigma)$. While implementing the algorithm, a graph will be represented by a matrix that gives, for every pair of vertices, the cost of the edge connecting them (the entries in the matrix are from the domain $\mathcal{B}$).

Consider a matrix A representing the reduced graph $G^*(x_1, \ldots x_{j-1})$. Step 1 corresponds to adding an extra row and column to A. At step 2, we need to check if the updated matrix has a negative cost cycle, and if not, compute the new shortest distances. Observe that, for any pair of vertices v and v', the new shortest distance between v and v' is different from the old one, only if the new shortest path visits the new vertex $v_j$. This fact can be used to compute the new shortest distances efficiently: in time $O(m^2)$, where m is the number of vertices in the current graph. Step 3 ensures that the updated matrix A stores only the vertices that are external to $x_1, \ldots x_j$, and hence at most 2K vertices. Thus, the overall time complexity of the algorithm is $O(N \cdot K^2)$.

Theorem 1 The problem of deciding whether a string $\sigma$ is timing consistent can be solved in time $O(|\sigma| \cdot K^2)$.

Testing Consistency of Sequences

If the language inclusion $\mathcal{L}(P) \subseteq \mathcal{L}(T)$ fails, since P and T have finite state spaces, we can find a sequence $x \in \mathcal{L}(P) \setminus \mathcal{L}(T)$ of the form $x = \sigma' \sigma^\omega$ (for strings $\sigma'$, $\sigma \in \Sigma^+$).

First observe that it is possible that $\sigma' \sigma$ is consistent, while for some i, $\sigma' \sigma^i$ is not.

Example 2 Consider two processes $P_1$ and $P_2$. The process $P_1$ has a delay $\delta_1$, and the process $P_2$ has a delay $\delta_2$. We use $b_i$ and $e_i$ to denote the beginning and ending of the delays of the processes $P_i$, as in Example 1. Let $$\sigma' = (b_1)$$

$$\sigma = (b_2, \{e_1, b_1\}, e_2).$$

If $\alpha(\delta_1) = \beta(\delta_1) = n$ and $\alpha(\delta_2) = \beta(\delta_2) = n+1$, it is easy to see that $\sigma' \sigma^i$ is consistent iff $i \leq n$.

Now we proceed to develop an algorithm for checking consistency of x. We start by showing how to reduce the problem of checking consistency of a sequence to checking consistency of its subsequences.

Combining Two Reduced Graphs

Consider a string $\sigma_1$ that is the concatenation of two strings $\sigma_2$ and $\sigma_3$. If either $\sigma_2$ or $\sigma_3$ is timing inconsistent then so is $\sigma_1$. Consider the reduced graphs $G^*(\sigma_2)$ and $G^*(\sigma_3)$. We can put these two graphs together by connecting the vertices in $V^*_e(\sigma_2)$ to the vertices in $V^*_b(\sigma_3)$ by the appropriate edges (i.e., by connecting the begin-delay events in $\sigma_2$ with their matching end-delay events in $\sigma_3$). If the resulting graph has a negative cycle, then $\sigma_1$ is timing inconsistent. Otherwise, we can compute the shortest distances in this new graph, and then delete the vertices not in $V^*(\sigma_1)$ to obtain $G^*(\sigma_1)$. This step takes only time $O(K^3)$.

Lemma 2 For a string $\sigma$, the reduced graph $G^*(\sigma^m)$ can be computed in time $O(|\sigma| \cdot K^2 + K^3 \cdot \lceil \log m \rceil)$.

The lemma follows from the facts that $G^*(\sigma)$ can be computed in time $O(|\sigma| \cdot K^2)$, and the reduced graph $G^*(\sigma^m)$ can be computed from $G^*(\sigma^{m/2})$ in time $O(K^3)$.

Now consider a sequence x that is the concatenation of a string $\sigma$ and a sequence x'. In the previous section, we defined reduced graphs for strings, we can define reduced graphs for sequences similarly (note that for a sequence x', $V^*(x') = V^*_b(x')$). Now we can test consistency of x by putting together the reduced graphs $G^*(\sigma')$ and $G^*(x')$. ¿From this, it follows that If there is an algorithm which tests whether $\sigma^\omega$ is timing consistent, and if so, computes the reduced graph $G^*(\sigma^\omega)$, then it is possible to check timing consistency of $\sigma'\sigma^\omega$ with additional time complexity $O(|\sigma'| \cdot K^2 + K^3)$.

Computing the Shortest Distances within the Periodic Graph $G(\sigma^\omega)$ The periodic graph $G(\sigma^\omega)$ can be considered as the concatenation of infinitely many copies of the graphs $G^*(\sigma)$. Suppose $G^*(\sigma)$ has m vertices, $m \leq 2K$, and let us denote the vertices in the j-th copy of $G^*(\sigma)$ by $v_1^j, \ldots v_m^j$. We will use $G_l^k$, $1 \leq k \leq l$, to denote the subgraph of $G(\sigma^\omega)$ consisting of l copies of $G^*(\sigma)$ starting from k-th copy, and $G^k$ to denote the subgraph consisting of infinite number of copies starting from k-th copy. It should be clear that for every k,k',l, the graphs $G_l^k$ and $G_l^{k'}$ are isomorphic, and the graphs $G^k$ and $G^{k'}$ are also isomorphic.

Now the problem of computing $G^*(\sigma^\omega)$ can be rephrased as computing the shortest distances between every pair of vertices $v_i^1$ and $v_j^1$ in the first copy. Let $d^k(i,j)$ denote the shortest distance between $v_i^1$ and $v_j^1$ in the subgraph $G_k^1$ (i.e., the graph will only first k copies), and let $d(i,j)$ be the shortest distance between $v_i^1$ and $v_j^1$ in the entire graph $G(\sigma^\omega)$. Equivalently, $d^k(i,j)$ is the shortest distance between $v_i^l$ and $v_j^l$ in the subgraph $G_k^l$, and $d(i,j)$ the shortest distance between $v_i^l$ and $v_j^l$ in the subgraph $G^l$, for any $l>0$.

The question is whether $d(i,j)$ can be determined by computing the values of $d^k(i,j)$ up to a small k. The following lemma gives the answer in the case where there is a shortest path between $v_i^1$ and $v_j^1$ (i.e., the case where $d(i,j) \neq -\infty$). It shows that if the shortest distance between $v_i^1$ and $v_j^1$ can be reduced by considering additional copies of $G(\sigma)$ beyond $m^2$ copies, then, in fact, it can be reduced repeatedly by "pumping" appropriate paths, and hence, is unbounded.

Lemma 3 For every pair of vertices $v_i^1$ and $v_j^1$, either $d(i,j)$ is $-\infty$ or equals $d^{m^2}(i,j)$.

Proof. Consider a pair of vertices $v_i^1$ and $v_j^1$ such that $d(i,j) < d^{m^2}(i,j)$. We will show that, in such a case, $d(i,j)$ is $-\infty$. Let $\rho$ be the smallest, in terms of the number of edges, path between $v_i^1$ and $v_j^1$ such that the cost of $\rho$ is less than $d^{m^2}(i,j)$. Let us denote the cost by $c(\rho)$.

Figure 11:
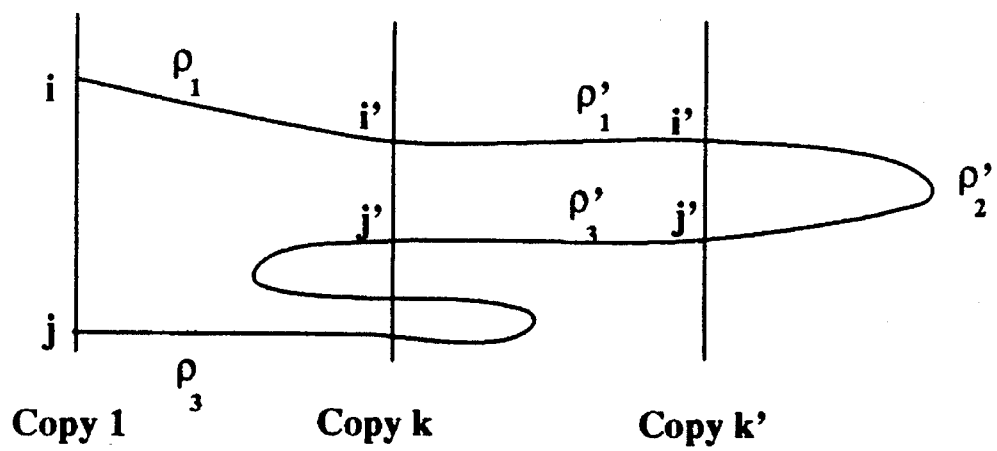
FIG. 11 shows how the shortest distances may be computed within a periodic graph.

Let us say that a pair (i',j') belongs to the path $\rho$, iff for some k, $\rho$ can be written as $$v_i^1 \xrightarrow{\rho_1} v_{i'}^k \xrightarrow{\rho_2} v_{j'}^k \xrightarrow{\rho_3} v_j^1$$

such that the path $\rho_2$ lies entirely in the subgraph $G^k$. Since there are only $m^2$ such pairs, and the path $\rho$ does not lie entirely within $G_{m^2}^1$, it follows that there exists a pair (i',j') that belongs to $\rho$ and also to $\rho_2$. That is, the path $\rho$ can be split as:

$$v_i^1 \xrightarrow{\rho_1} v_{i'}^k \xrightarrow{\rho_1'} v_{i'}^{k'} \xrightarrow{\rho_2'} v_{j'}^{k'} \xrightarrow{\rho_3'} v_{j'}^k \xrightarrow{\rho_3} v_j^1$$

such that the path $\rho_2'$ lies entirely within the subgraph $G^k$ and the path $\rho_2 = \rho_1' \rho_2' \rho_3'$ lies entirely within $G^k$ (see FIG. 11).

Recall that the subgraphs $G^k$ and $G^{k'}$ are isomorphic, and hence $\rho_2'$ can be considered to be a path between $v_{i'}^k$ and $v_{j'}^k$ (to be precise, the superscripts of the vertices appearing on $\rho_2'$ need to be shifted by (k'-k), but we will slightly abuse the notation). In fact, for every $n \geq 0$, we have the path $(\rho_1')^n \rho_2'(\rho_3')^n$ between $v_{i'}^k$ and $v_{j'}^k$.

Now consider the path $\rho_1 \rho_2' \rho_3$ between $v_i^1$ and $v_j^1$. If $c(\rho_1 \rho_2' \rho_3) \leq c(\rho)$, then we have a path from $v_i^1$ and $v_j^1$ with cost less than $d^{m^2}(i,j)$ and with less edges than $\rho$. Hence, by the choice of $\rho$, $c(\rho_1 \rho_2' \rho_3) > c(\rho)$. This implies that $c(\rho_1') + c(\rho_3') < 0$. This means that the segments $\rho_1'$ and $\rho_3'$ can be "pumped" to reduce the cost further and further: $c((\rho_1')^n \rho_2'(\rho_3')^n)$ forms a strictly decreasing sequence with increasing values of n. This implies that there is no "shortest" path between the vertices $v_i^k$ and $v_j^k$, and hence, $d(i,j) = -\infty$.

The next question is to determine the pairs of vertices $v_i^1$ and $v_j^1$ for which there is no "shortest" path and $d(i,j)$ is $-\infty$. Clearly, if $d^{2m^2}(i,j) < d^{m^2}(i,j)$ then $d(i,j)$ is $-\infty$ by the above lemma. But the converse of this statement does not hold.

Figure 12:
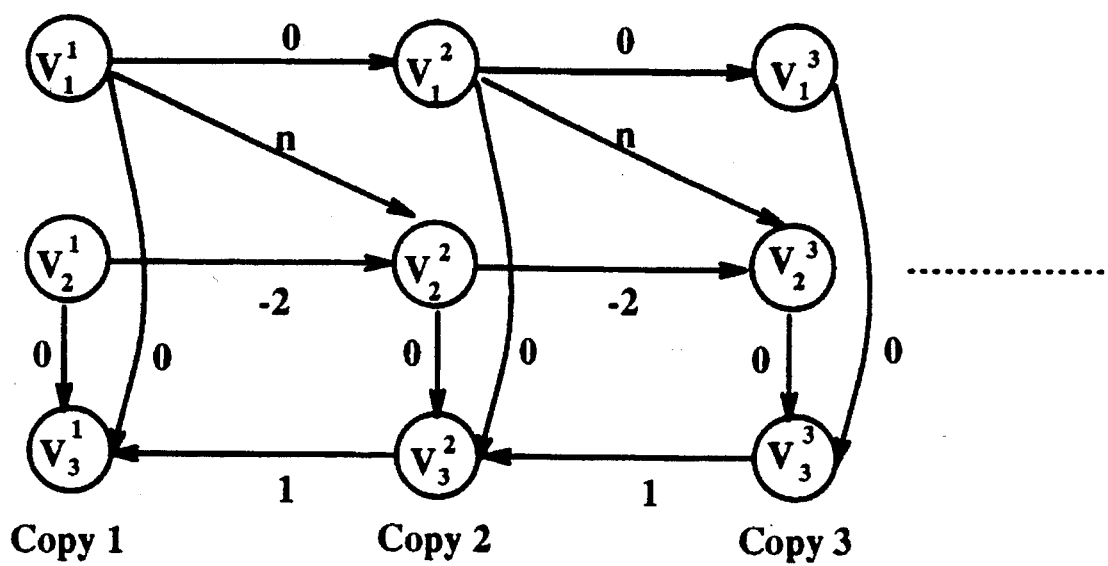
FIG. 12 shows a periodic graph.

Example 3 Consider the graph shown in FIG. 12. A single copy consists of 3 vertices. Note that the distance between the vertices $v_2^1$ and $v_3^1$ decreases at every step: $d^k(2,3) = -k+1$. Thus $d^{18}(2,3) < d^9(2,3)$, and this allows us to correctly conclude that $d(2,3) = -\infty$. The situation is quite different for the distance between $v_1^1$ and $v_3^1$: $d^k(1,3) = 0$ for $k \leq n+4$ and $d^k(1,3) = n+4-k$ for $k > n+4$. Thus the shortest distance does not change in the beginning. If the cost n exceeds 14, then $d^{18}(1,3) = d^9(1,3)$, and yet, $d(1,3) = -\infty$. Thus a different criterion is required to conclude $d(1,3) = -\infty$; it should follow from the facts that $d(2,3) = -\infty$ and there exists a finite cost edge from $v_1^1$ to $v_2^2$ and from $v_3^2$ to $v_3^1$.

The next lemma characterizes pairs (i,j) such that $d(i,j) = -\infty$.

Lemma 4 Let $v_i^1$ and $v_j^1$ be a pair of vertices such that $d(i,j) = -\infty$ and $d^{m^2}(i,j) \neq -\infty$. Then there exists some pair (i',j') such that $d^{2m^2}(i',j') < d^{m^2}(i',j')$ and in the graph $G^1$ there exist paths from $v_i^1$ to $v_{i'}^k$ and from $v_{j'}^k$ to $v_j^1$, for some $k>0$.

Proof. Consider a pair of vertices $v_i^1$ and $v_j^1$ such that $d(i,j) < d^{m^2}(i,j)$. The proof is very similar to the proof of Lemma 3. Let $\rho$ be the smallest, in terms of the number of edges, path between $v_i^1$ and $v_j^1$ such that the cost of $\rho$ is less than $d^{m^2}(i,j)$. Let (i',j') be a pair such that the path $\rho$ can be split as $$v_i^1 \xrightarrow{\rho_1} v_{i'}^k \xrightarrow{\rho_1'} v_{i'}^{k'} \xrightarrow{\rho_2'} v_{j'}^{k'} \xrightarrow{\rho_3'} v_{j'}^k \xrightarrow{\rho_3} v_j^1$$

such that the path $\rho_2 = \rho_1' \rho_2' \rho_3'$ visits least number of different copies. This added restriction on the choice of (i',j') implies that the path $\rho_2$ lies within the subgraph $G_{m^2}^k$. Let $\rho''_2$ be the shortest path between $v_{i'}$ and $v_{j'}$ that lies within $m^2$ copies, that is, $c(\rho''_2) = d^{m^2}(i',j')$. Now the path $\rho'_1 \rho''_2 \rho'_3$ lies within $2m^2$ copies, and, since $c(\rho_1') + c(\rho_3') < 0$ (as in the proof of Lemma 3), has cost less than $c(\rho''_2)$. This means that $d^{2m^2}(i',j') < d^{m^2}(i',j')$, and this proves the lemma.

To find all pairs $(i,j)$ with $d(i,j) = -\infty$ using the above lemma, we construct an edge-labeled graph $G_{inf}$ over the vertex set $\{v_1, \ldots v_m\}$ with the labels $\{a,b,c,d\}$ as follows:

1. If $G^*(\sigma)$ has an edge from $v_i$ to $v_j$ then $G_{inf}$ has a-labeled edge from $v_i$ to $v_j$.
2. If $d^{2m^2}(i,j) < d^{m^2}(i,j)$ then $G_{inf}$ has b-labeled edge from $v_i$ to $v_j$.
3. If $G_2^1$ has an edge from $v_i^1$ to $v_j^2$ then $G_{inf}$ has c-labeled edge from $v_i$ to $v_j$.
4. If $G_2^1$ has an edge from $v_i^2$ to $v_j^1$ then $G_{inf}$ has d-labeled edge from $v_i$ to $v_j$.

Next we define a language $L_{inf}$ over the alphabet $\{a,b,c,d\}$ to consist of all the words $\omega$ such that 1. the number of c's is equal to the number of d's;
2. in every prefix of $\omega$, the number of c's is at least as large as the number of d's;
3. there is at least one b.

¿From the graph $G_{inf}$ we build the desired set $S_{inf}$:

$(i,j) \in S_{inf}$ iff there exists a path $\rho$ from $v_i$ to $v_j$ in $G_{inf}$ such that $\rho$ spells a word in $L_{inf}$.

The next lemma follows from the previous lemmas and the definitions:

Lemma 5 For every pair of vertices $v_i^1$ and $v_j^1$, if $(i,j) \in S_{inf}$ then $d(i,j) = -\infty$, otherwise $d(i,j) = d^{m^2}(i,j)$.

Computing the Set $S_{inf}$

Given an edge-labeled graph and a language L, the L-transitive closure problem is to compute all pairs of nodes $(v_i, v_j)$ for which there exists a path from $v_i$ to $v_j$ that spells a word in L. Thus computing the set $S_{inf}$ corresponds to computing the $L_{inf}$-transitive closure of the graph $G_{inf}$.

It is easy to see that the language $L_{inf}$ can be recognized by a deterministic 1-counter machine A (a special case of a pushdown automaton). Let A be a machine which reads the symbols of the input word one by one and does the following: on symbol a it does nothing, on b it moves to a state that signifies that A has seen at least one b, on symbol c it increments the counter (staying in the same state), and on d it decrements the counter if it was positive and rejects the whole input if the counter was 0. The machine accepts if after processing the input word it has been some b and the counter is 0. Thus, the language $L_{inf}$ is context-free. The L-transitive closure problem for a context-free language can be solved in cubic time $O(m^3)$ in the number m of nodes by employing a method described in M. Yannakakis, "Graph-theoretic methods in database theory", in: *Proceedings of the 9th ACM Symposium on Principles of Data Base Systems*, pp. 230–242, 1990, giving the following lemma:

Lemma 6 The set of pairs $S_{inf}$ can be computed in time $O(m^3)$.

The algorithm is derived from a context-free grammar for $L_{inf}$ in Chomsky normal form. We will described now in more concrete terms the algorithm for our case. It uses the following grammar:

$A \rightarrow a|b|AA|A'd$ $A' \rightarrow c|cA$ $B \rightarrow b|BA|AB|B'd$ $B' \rightarrow cB$ We will compute iteratively four sets A,A',B,B' of pairs of nodes. A pair $(v_i, v_j)$ will be in A at the end of the algorithm iff there is a path from $v_i$ to $v_j$ which spells a word that satisfies conditions 1 and 2 in the definition of $L_{inf}$ (but possibly not 3); it will be in A' iff the word satisfies the following modified conditions: 1'. the number of c's is one more than the number of d's; and 2'. in every prefix the number of c's is strictly larger than the number of d's. The sets B and B' are defined analogously except that, in addition, the word must also contain one b (i.e., satisfy condition 3 in the definition of $L_{inf}$). Thus, the desired set $S_{inf}$ is given by the final value of B. These sets are represented by Boolean matrices whose rows and columns are indexed by the nodes of the graph. In addition, for each of the four sets we have a list of "unprocessed" pairs, $S_A, S_{A'}$ etc.

The data structures are initialized as follows: For every a-labeled edge, insert the corresponding pair of nodes to A (i.e., set the corresponding entry of matrix A to 1) and to the list $S_A$. For every b-labeled edge, insert the corresponding pair to A,B,$S_A$,$S_B$. For every c-labeled edge, insert the pair to A' and $S_{A'}$; we do nothing for the d-labeled edges.

In the iterative step, we remove a pair from one of the lists and "process" it; the algorithm terminates when the lists are empty. A pair $(v_i, v_j)$ is processed as follows depending on the list it is taken from.

Case 1: List $S_A$. For every member $(v_j, v_k)$ of A (respectively B), if $(v_i, v_k)$ is not in A (resp. B), then add it to A and to $S_A$ (resp. B and $S_B$). For every member $(v_k, v_i)$ of A (respectively B), if $(v_k, v_j)$ is not in A (resp. B), then add it to A and to $S_A$ (resp. B and $S_B$). For every edge $(v_k, v_i)$ labeled c, if $(v_k, v_j)$ is not in A', then add it to A' and to $S_{A'}$.

Case 2: List $S_B$. For every member $(v_j, v_k)$ of A, if $(v_i, v_k)$ is not in B, then add it to B and to $S_B$. For every member $(v_k, v_i)$ of A, if $(v_k, v_j)$ is not in B, then add it to B and to $S_B$. For every edge $(v_k, v_i)$ labeled c, if $(v_k, v_j)$ is not in B', then add it to B' and to $S_{B'}$.

Case 3: List $S_{A'}$. For every edge $(v_j, v_k)$ labeled d, if $(v_i, v_k)$ is not in A, then add it to A and to $S_A$.

Case 4: List $S_{B'}$. For every edge $(v_j, v_k)$ labeled d, if $(v_i, v_k)$ is not in B, then add it to B and to $S_B$.

Removing a pair from a list and processing it takes time $O(m)$. Since every pair is inserted (and therefore also removed) at most once in each list, it follows that the time complexity is $O(m^3)$.

Algorithm for Testing Consistency of x

Now we can put together all the pieces to obtain the algorithm of FIG. . Algorithm of FIG. is used to test the consistency of $\sigma'$ and $\sigma$, and to compute the reduced graphs $G^*(\sigma')$ and $G^*(\sigma)$. Step 3 takes time $O(m^3 \lceil \log m \rceil)$. Computing the set $S_{inf}$ at step 4 can be performed in time $O(m^3)$ as outlined earlier. Combining the two graphs $G^*(\sigma')$ and $G^*(\sigma^\omega)$, and testing for negative cost cycles is easy. This gives the following theorem:

Theorem 2 The problem of deciding whether a sequence $\sigma'\sigma^\omega$ is timing consistent is solvable in time $O((|\sigma'|+|\sigma|) \cdot K^2 + K^3 \lceil \log K \rceil)$.

Finding the Optimal Delay Constraint

Given a delay constraint $D = (\Delta, \alpha, \beta)$ it is possible to construct an automaton $P_D$ that accepts precisely those sequences that are timing-consistent with respect to D. This is done by using the algorithm for constructing the region automaton of the Alur and Dill reference supra. The size of the region automaton grows exponentially with the size of the delay constraints as follows. Let I be the set $\{i | \Delta \cap \Delta_i \neq \emptyset\}$, and for a delay $\delta$, let $\gamma(\delta)$ be $\beta(\delta)$ when it is not $\infty$, and $\alpha(\delta)$ otherwise. Then the number of states of the region automaton is bounded by $$|I|! \times \pi_{i \in I} |\Delta_i \cap \Delta| \times \max\delta \in_{\Delta_i \cap \Delta} \{\gamma(\delta) + 1\}.$$

On finding that x is timing inconsistent with the delay constraint $D=(\Delta_P,\alpha,\beta)$, the next step is to find an "optimal" delay constraint, namely a delay constraint $D(x)$ with $P_{D(x)}$ as small as possible, subject to:

1. x is timing inconsistent with $D(x)$, and
2. $\mathcal{L}(P_D) \subseteq \mathcal{L}(P_{D(x)})$.

Notice that the condition 2 ensures that to prove that the implementation augmented with $P_D$ satisfies the specification, it suffices to prove that the implementation augmented with $P_{D(x)}$ satisfies the specification.

We find the desired delay constraint in two steps: in the first step we find a small set $\Delta(x)$ of delays such that x is timing inconsistent with the delay constraint $(\Delta(x),\alpha,\beta)$; and in the second step we try to modify the bounds $\alpha$ and $\beta$ to obtain $D(x)=(\Delta(x),\alpha',\beta')$. Our approach does not guarantee the minimality of the size of $P_{D(x)}$; it is only a heuristic to reduce the size.

Finding a Minimum Set of Inconsistent Delays

First observe that, if $D=(\Delta,\alpha,\beta)$ and $D'=(\Delta',\alpha,\beta)$ with $\Delta' \subseteq \Delta$, then $\mathcal{L}_D(1) \subseteq \mathcal{L}_{D'}(1)$. Thus we can discard delays that do not contribute to the inconsistency of x. Consequently, we try to find a minimal set of delays that is necessary for the timing inconsistency of x. This is done in two steps.

First we find a set $\Delta$ of delays such that x is timing inconsistent with $(\Delta,\alpha,\beta)$, and $\Delta$ involves the least number of processes, that is, $|\{i|\Delta \cap \Delta_i \neq \emptyset\}|$ is minimum. We, therefore, look for a minimum size subset $I \subseteq \{1, \ldots, K\}$, such that x is inconsistent also with the delay constraint $D_I=(\cup_{i \in I}\Delta_i,\alpha,\beta)$. That is to say, if we run the algorithm of the previous section ignoring the delay events of the processes not in I, we should still end up with timing inconsistency.

We can show that

The problem of finding a subset $I \subseteq \{1,\ldots K\}$ of minimum size such that a string $\sigma$ is timing inconsistent with respect to $(\cup_{i \in I}\Delta_i,\alpha,\beta)$ is NP-complete.

Therefore, we exhaustively consider subsets of $\{1, \ldots, K\}$ in order of increasing size, starting with subsets of size 2. If the smallest I has size n, then the time complexity increases by a factor of $\min\{2^K,K^n\}$. Hopefully, n will indeed be small. When n is much larger, then the region automaton is far too large to implement in general, and thus, this exhaustive search is not a bottleneck of the algorithm.

Having identified the minimal set I of processes, the second step is to find a minimal subset $\Delta(x)$ of $\cup_{i \in I}\Delta_i$ preserving the timing-inconsistency of x. This is again done by an exhaustive search over all the subsets of $\cup_{i \in I}\Delta_i$. Clearly, the set $\Delta(x)$ consists of only the delays corresponding to the edges involved in the negative cost cycle.

Relaxing the Bounds

Having identified the optimal set $\Delta(x)$ of delays, we want to adjust the bounding functions $\alpha$ and $\beta$ so as to reduce the sizes of the constants.

We start with a simple observation that dividing all bounds by a common factor does not affect timing consistency. Let D be a delay constraint $(\Delta,\alpha,\beta)$, and k be the greatest common divisor of all the constants bounding the delays in $\Delta$. Define new lower and upper bounds for the delays by: $\alpha'(\delta)=\alpha(\delta)/k$ and $\beta'(\delta)=\beta(\delta)/k$. It is easy to prove that $\mathcal{L}_D(1)=\mathcal{L}_{D'}(1)$. This property can be used to reduce the size of the region automaton. Instead of using the delay constraint $D=(\Delta(x),\alpha,\beta)$ we use scaled down versions of $\alpha$ and $\beta$, and construct the region automaton $P_{D'}$. If the greatest common divisor k is large, this leads to a big saving: the size of $P_{D'}$ is smaller than that of $P_D$ by a factor of $k^{|\eta|}$.

It is unlikely that we can apply the optimization of dividing by the greatest common divisor, by itself. However, the situation may improve dramatically if we "preprocess" the bounding functions by relaxing the lower and upper bounds. Again let $D=(\Delta,\alpha,\beta)$ be a delay constraint. Consider a delay $\delta \in \Delta$ with lower bound a and upper bound b. Suppose we replace these bounds by $a' \leq a$ and $b' \geq b$, respectively; that is, we relax the delay bounds by decreasing the lower bound and increasing the upper bound. Let D' be the new delay constraint. It is obvious that any sequence that is timing-consistent with D is also consistent with D' (but not vice versa). Hence, $\mathcal{L}_D(1) \subseteq \mathcal{L}_{D'}(1)$. However, if we use D' obtained by this transformation as it is, there is no computational benefit; in fact, since we are increasing the upper bounds the size of the region automaton increases. But note that the scaling transformation may be applicable to the new delay bounds in a more effective way than it was to the original bounds. Thus the objective of changing the bounds is to make them all integral multiples of some large common factor. However we should not relax the bounds too much: in particular, we require that the counter-example x is timing inconsistent with respect to D' also. This can be easily understood by an example:

Example 4 Consider two delays: delay $\delta_1$ of $P_1$ with lower bound $0$ and upper bound 2, and delay $\delta_2$ of $P_2$ with lower bound 5 and upper bound $\infty$. Suppose in the counter-example x both $P_1$ and $P_2$ begin their delays at the first step, and end their delays at the second step: $b_1(x_1)=e_1(x_2)=\delta_1$, and $b_2(x_1)=e_2(x_2)=\delta_2$. Clearly this scenario is timing inconsistent. If we construct a region automaton, the number of states is 2·5·1 (for some l). To reduce the size, we first replace the lower bound $\alpha(\delta_2)$ by 4 which imposes a weaker bound. Now we can divide all bounds by their common factor, 2. Then $\delta_1$ has lower bound 0 and upper bound 1, whereas $\delta_2$ had lower bound 2 and upper bound $\infty$. The number of states in the new region automaton is 1·2·1, a saving by a factor of 5. Note that had we replaced the original lower bound for $\delta_2$ by 2, we could have eventually reduced all bounds to 1 after scaling. But this would not have been helpful because x would have been timing-consistent with the new constraints.

Thus the problem is to construct new lower and upper bound maps $\alpha'$ and $\beta'$ from the delay constraint $(\Delta(x),\alpha,\beta)$ by replacing, for each delay $\delta \in \Delta(x)$, its lower bound $\alpha(\delta)$ by $\alpha'(\delta) \leq \alpha(\delta)$, and its upper bound $\beta(\delta)$ by $\beta'(\delta) \geq \beta(\delta)$, such that x is timing inconsistent with $(\Delta(x),\alpha',\beta')$, so as to minimize the magnitudes of constants after scaling (dividing by the greatest common divisor of all the bounds). Recall that the algorithm to test consistency of x reports that x is inconsistent when it finds a negative cost cycle in the associated weighted graph $G(x)$. We adjust the delay bounds so that the negativeness of the cost of this cycle is preserved. Recall that in the weighted graph all upper bounds appear as positive costs and all lower bounds appear as negative costs. Now the optimization problem can be stated precisely as follows.

Given a set of nonnegative integers $C=\{a_1, \ldots a_m, b_1, \ldots b_n\}$ such that $\Sigma_j b_j < \Sigma_i a_i$ find another set of nonnegative integers $C'=\{a'_1, \ldots a'_m, b'_1, \ldots b'_n\}$ such that 1. $a'_i \leq a_i$ for $1 \leq i \leq m$,
2. $b'_j \geq b_j$ for $1 \leq j \leq n$,
3. $\Sigma_j b'_j < \Sigma_i a'_i$ so as to minimize the maximum of the set $\{n/\gcd(C') | n \in C'\}$.

We solve the problem using the following facts:

1. The greatest common divisor of the optimal solution set $C'$ cannot exceed the maximum of $a_1, \ldots a_m$.
2. If the greatest common divisor of the optimal solution set is $k$ then it is easy to find the optimal solution. First, choose $a'_i = \lfloor a_i/k \rfloor$ and $b'_j = \lceil b_j/k \rceil$, and then keep subtracting $k$ from the largest $a'_i$ as long as condition 3 holds (this does not involve much computation assuming that $a_i$'s are sorted initially).

Putting these two pieces together, we get a pseudo-polynomial algorithm which runs in time $O[(m+n) \cdot \max\{a_i\}]$.

Now the delay constraint $D(x)=(\Delta(x), \alpha', \beta')$ is chosen as follows. For a delay $\delta \in \Delta(x)$, if $\alpha(\delta)$ equals some $a_i \in C$ then we set $\alpha'(\delta)$ to be $a'_i$ of the optimal solution; if $\alpha(\delta)$ is not in C (that is, the lower bound edge is not in the negative cost cycle) then we set $\alpha'(\delta)=0$. Similarly, if $\beta(\delta)=b_j$ then we set $\alpha'(\delta)=b'_j$; if $\beta(\delta)$ is not in C then we set $\beta'(\delta)=\infty$.

IMPLEMENTATION IN THE ANALYSIS-DEVELOPMENT APPARATUS: FIGS. 14–16

Figure 14:
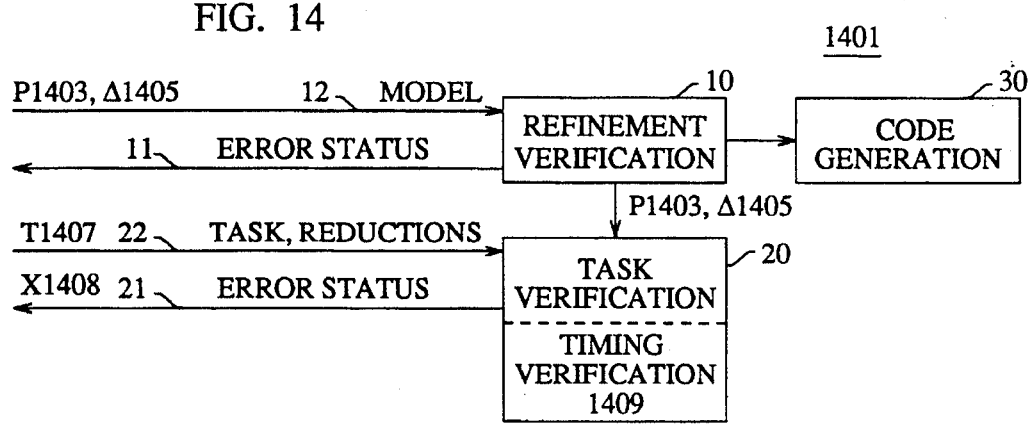
FIG. 14 shows how the invention may be implemented within the analysis/development apparatus of the parent application.

In a preferred embodiment, the technique just described is implemented in the analysis/development apparatus disclosed in the parent application. FIG. 14 gives an overview of that implementation. FIG. 14 is based on FIG. 1 of the parent application. Analysis/development apparatus 1401 shown in FIG. 14 adds a new element, timing verification 1409, to task verification 20 of the apparatus of FIG. 1 and takes new inputs: in addition ot the set of processes P 1403 for which code is to be generated in box 30, the inputs at model 12 now include timing constraints Δ 1405 for the set of processes and the inputs at task 22 include temporal property T 1407 to be satisfied by the set of processes. There is further a new output at error status 21, namely counter-example x 1408.

Operation is as follows: The timing constraints Δ input as part of model 12, together with set of processes P 1403 go to refinement verification 10, and after refinement, to task verification 20. In task verification 20, one of the tasks is temporal property T 1407. Timing verification portion 1409 of task verification 20 employs P 1403, Δ 1405, and T 1407 in the manner discussed above to verify that P 1403's timing constraints 1405 permit property T to be satisfied. If they cannot be, error status 21 returns counter-example 1408 to the user of the system. If they can be, the set of processes P 1403 as modified by the timing verification becomes part of system definition 15 and is used in code generation 30.

Figure 15:
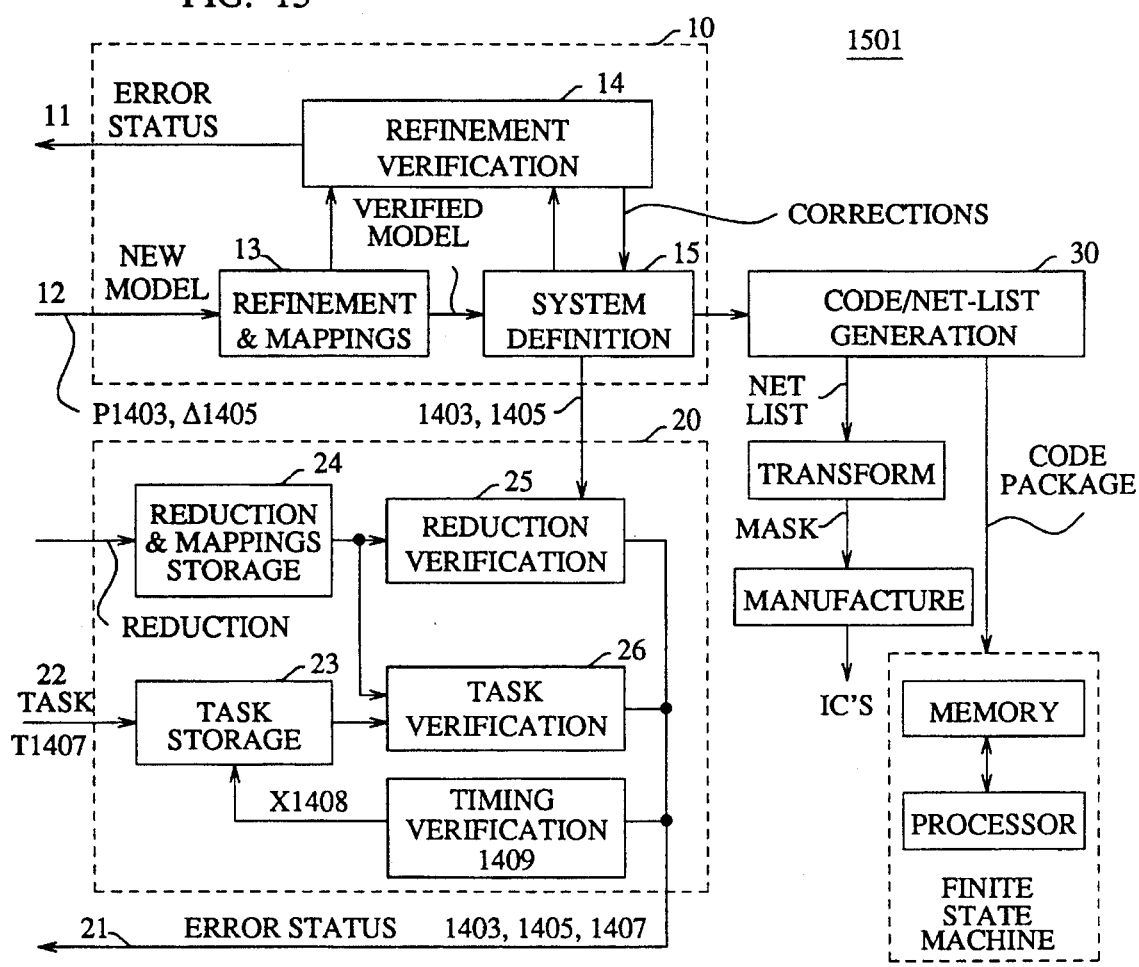
FIG. 15 shows a detail of the implementation in the analysis/development apparatus of the parent application.

FIG. 15 shows the implementation in more detail. FIG. 15 is based on FIG. 2 of the parent patent application and shows analysis/development apparatus 1501. Inputs and outputs are the same as for apparatus 1401. As can be seen from FIG. 15, the relationship between timing verification portion 1409 is the following: timing verification portion 1409 receives inputs P 1403, Δ 1405, and T 1407 from task verification 26 and performs the timing verification operation; if property T 1407 cannot be satisfied, counter-example x 1408 is returned to task storage 23, which in turn provides it to task verification 26 for output as an error message on error status 21.

Figure 16:
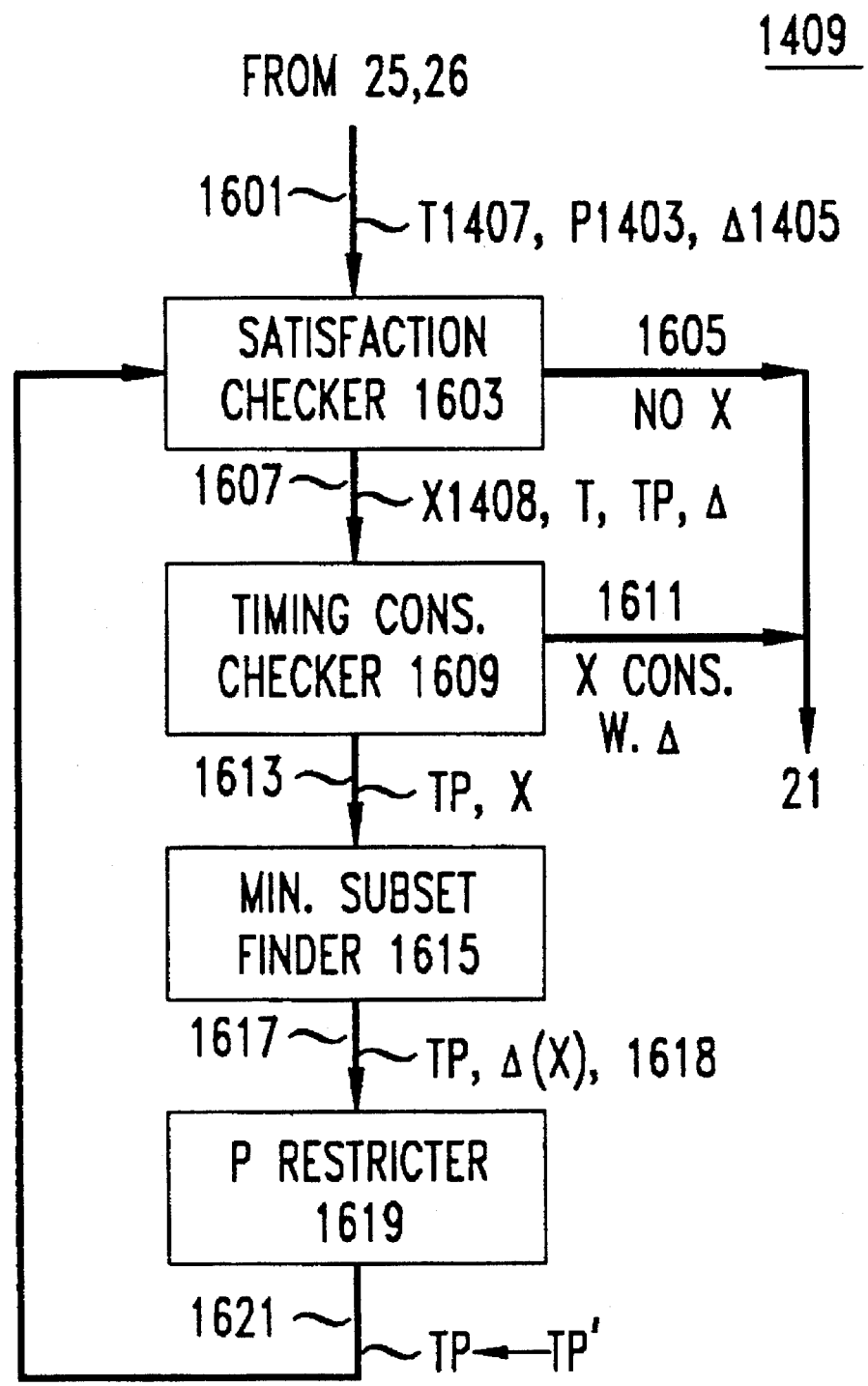
FIG. 16 shows a further detail of the implementation in the analysis/development apparatus of the parent application.

FIG. 16, finally, provides an overview of the components of timing verification portion 1409 and their cooperation. Timing verification component 1409 receives T 1407, P 1403, and Δ 1405 from boxes 25 and 26 of FIG. 15 at 1601. The first component is satisfaction checker 1603, which determines whether a test set of processes TP 1621 with delay constraints Δ 1405 satisfies temporal property T. If it does, operation of timing verification portion 1409 ceases and no error status is returned from portion 1409 on 21. The first test set of processes 1621 is of course the set of processes P 1403.

If the test set of processes 1621 does not satisfy temporal property T 1407, satisfaction checker 1603 produces counter-example x 1408, which it provides as shown at 1607 to the next component, timing consistency checker 1609, together with T 1407 and the current TP 1621. Timing consistency checker 1609 determines whether counter-example 1408 is consistent with the delay constraints 1405. If it is, counter-example 1408 is returned at 1611 to error status 21 and operation of timing verification portion 1409 ceases. If counter-example 1408 is not consistent, counter-example 1408 and test set of processes 1621 are provided via 1613 to minimum subset finder 1615, which finds the minimum subset of delay constraints for which counter-example 1405 holds. The minimum subset Δ(x) appears at reference number 1618 in FIG. 16. Minimum subset 1618 and test processes 1621 are provided via 1617 to process restricter 1619, which restricts set of test processes 1621 as required by minimum subset 1618 to produce set of test processes TP'. Set of test processes 1621 is then set to TP', and new set of test processes 1621 are input to satisfaction checker 1603. As set forth in the preceding discussion, the algorithms used in components 1603, 1609, 1615, and 1619 are all guaranteed to terminate, as is component 1409 itself, and consequently, the implementation is computationally tractable.

CONCLUSION

The foregoing Detailed Description has disclosed to one of ordinary skill in the art how to employ techniques by means of which it can be determined whether a set of processes with delay constraints conform to a given temporal property and has shown how these techniques may be implemented in the analysis/development apparatus of the parent application. While the foregoing disclosure has shown the best mode presently known to the inventors of practicing the invention, many variations are possible. For example, algorithms other than those specified herein may be used to determine whether the test processes satisfy the temporal property, to check timing consistency, to find the minimum subset of delay constraints, to find the optimal delay constraint, and to construct the new set of test processes. Further, the techniques of the invention may be employed in any apparatus for testing system designs, not just the analysis/development apparatus of the parent patent application.

For all of these reasons, the foregoing Detailed Description is to be understood as being in all respects illustrative and exemplary, but not restrictive, and the scope of the invention is to be determined not from the Detailed Description, but rather from the appended claims as read in light of the Detailed Description and interpreted according to the Doctrine of Equivalents.

What is claimed is:

1. An improved method performed in a computer system for generating a machine-executable implementation specification for a system from a logical definition of an implementation of the system and a logical definition of the system's behaviour the logical definition of the system's behavior including a given temporal property and the logical definition of the implementation specifying a set of processes, each of which has delay constraint, the method including a step of verifying that the system will satisfy the logical definition of the system's behavior and the improvement comprising the steps practiced in the the step of verifying of:

determining whether a test set of processes derived initially from the set of processes satisfies the given temporal property, and if the test set does, returning an indication that the system satisfies the given temporal property and terminating the method; and otherwise providing a counter example of a sequence of behaviors of the processes of the test set which does not satisfy the given temporal property;

determining whether the counter example is timing consistent with the delay constraints and if the counter example is timing consistent, returning an indication that the system cannot satisfy the given temporal property and terminating the method; and employing the counter example to restrict the test set of processes and repeating the steps of the method with the restricted test set as the test set.

2. The method set forth in claim 1 wherein:

the step of employing the counter example to restrict the test set further comprises the steps of:

finding the minimum subset of delay constraints for which the counter example holds and restricting the test set of the processes as required by the minimum subset of delay constraints.

3. Improved apparatus implemented in a computer system for generating a machine-executable implementation specification for a finite state machine of practical size, the apparatus including refinement means for receiving a model of the finite state machine and refining the model and verification means for receiving the refined model and a task for the model which specifies a given temporal property and responding to the refined model and the task by verifying that the refined model can perform the task and the improvement comprising:

timing verification means in the verification means for verifying that delay constraints in the refined model satisfy the given temporal property, the timing verification means remaining computationally tractable for the finite state machine.

4. The apparatus set forth in claim 3 wherein:

the model includes a set of processes, each of which has at least one of the delay constraints; and the timing verification means comprises means for determining whether a test set of processes derived from the set of processes satisfies the given temporal property, and if the test set does, returning an indication that the system satisfies the given temporal property; and otherwise providing a counter example of a sequence of behaviors of the processes of the test set which does not satisfy the given temporal property;

means for determining whether the counter example is timing consistent with the delay constraints and if the counter example is timing consistent, returning an indication that the system cannot satisfy the given temporal property and terminating the method; and means for employing the counter example to restrict the test set of processes and repeating the steps of the method with the restricted test set as the test set.

5. The apparatus set forth in claim 4 wherein:

the means for employing the counter example to restrict the test set includes means for finding the minimum subset of delay constraints for which the counter example holds and means for restricting the test set of the processes as required by the minimum subset of delay constraints.

6. The apparatus as set forth in claim 3 further comprising:

means for producing the finite state machine.

7. A method used in apparatus for developing a finite state machine to develop a finite state machine of practical size comprising the steps performed in the apparatus for developing the finite state machine of:

receiving a model of the finite state machine;

refining the model; and verifying that the refined model can perform a task which specifies a given temporal property, the step of verifying including the step of verifying for the finite state machine in a computationally tractable manner that delay constraints in the refined model satisfy the given temporal property.

8. The method set forth in claim 7 wherein:

the model includes a set of processes, each of which has at least one of the delay constraints; and the step of verifying that the delay constraints satisfy a given temporal property includes the steps of determining whether a test set of processes derived from the set of processes satisfies the given temporal property, and if the test set does, returning an indication that the system satisfies the given temporal property; and otherwise providing a counter example of a sequence of behaviors of the processes of the test set which does not satisfy the given temporal property;

determining whether the counter example is timing consistent with the delay constraints and if the counter example is timing consistent, returning an indication that the system cannot satisfy the given temporal property and terminating the method; and employing the counter example to restrict the test set of processes and repeating the steps of the method with the restricted test set as the test set.

9. The method set forth in claim 8 wherein:

the step of employing the counter example to restrict the test set includes the steps of finding the minimum subset of delay constraints for which the counter example holds and restricting the test set of the processes as required by the minimum subset of delay constraints.

10. The method set forth in claim 7 further comprising the step of:

producing the finite state machine.

11. Improved apparatus implemented in a computer system for generating a machine-executable implementation specification for a system from a logical definition of the implementation and a logical definition of the system's behavior, the behavior including a given temporal property and the logical definition of the implementation specifying a set of processes with delay constraints, the apparatus including verification means for verifying that a system implemented according to the logical definition of the implementation will perform according to the logical definition of the system's behavior, and the improvement comprising:

timing verification means in the verification means for verifying that the delay constraints satisfy the given temporal property by executing steps including determining whether a test set of processes derived initially from the set of processes satisfies the given temporal property, and if the test set does, returning an indication that the system satisfies the given temporal property and terminating the method; and otherwise providing a counter example of a sequence of behaviors of the processes of the test set which does not satisfy the given temporal property;

determining whether the counter example is timing consistent with the delay constraints and if the counter example is timing consistent, returning an indication that the system cannot satisfy the given temporal property and terminating the method; and employing the counter example to restrict the test set of processes and repeating the steps of the method with the restricted test set as the test set.

* * * * *